US011249848B2

(12) United States Patent
Hwang et al.

(10) Patent No.: US 11,249,848 B2
(45) Date of Patent: Feb. 15, 2022

(54) ERROR CHECK CODE (ECC) DECODER AND MEMORY SYSTEM INCLUDING ECC DECODER

(71) Applicant: Samsung Electronics Co., Ltd., Suwon-si (KR)

(72) Inventors: Youngjun Hwang, Hwaseong-si (KR); Hongrak Son, Anyang-si (KR); Dongmin Shin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/134,961

(22) Filed: Dec. 28, 2020

(65) Prior Publication Data

US 2021/0397514 A1 Dec. 23, 2021

(30) Foreign Application Priority Data

Jun. 18, 2020 (KR) ........................ 10-2020-0074280

(51) Int. Cl.
*G06F 11/10* (2006.01)
*H03M 13/11* (2006.01)
*H03M 13/45* (2006.01)

(52) U.S. Cl.
CPC ..... *G06F 11/1076* (2013.01); *H03M 13/1102* (2013.01); *H03M 13/45* (2013.01)

(58) Field of Classification Search
CPC G06F 11/1076; H03M 13/1102; H03M 13/45
See application file for complete search history.

(56) References Cited

U.S. PATENT DOCUMENTS 7,843,727 B2 11/2010 Cho et al.
8,990,665 B1 * 3/2015 Steiner ................ H03M 13/451 714/780
9,086,982 B1 * 7/2015 Xu ....................... G11C 29/028
9,086,984 B2 7/2015 Alhussien et al.
(Continued)

FOREIGN PATENT DOCUMENTS

KR 10-2009-0048142 A 5/2009

OTHER PUBLICATIONS

Extended European Search Report dated Sep. 29, 2021, issued in corresponding European Patent Application No. 21164082.6.

*Primary Examiner* — Kyle Vallecillo
(74) *Attorney, Agent, or Firm* — Harness, Dickey & Pierce, P.L.C.

(57) ABSTRACT

An error check code (ECC) decoder includes a buffer, a data converter and a decoding circuit. The buffer stores a plurality of read pages read from a plurality of multi-level cells connected to a same wordline. The data converter adjusts reliability parameters of read bits of the plurality of read pages based on state-bit mapping information and the plurality of read pages to generate a plurality of ECC input data respectively corresponding to the plurality of read pages. The state-bit mapping information indicate mapping relationships between states and bits stored in the plurality of multi-level cells. The decoding circuit performs an ECC decoding operation with respect to the plurality of read pages based on the plurality of ECC input data. An error correction probability is increased by adjusting the reliability parameters of read bits based on the state-bit mapping information.

20 Claims, 37 Drawing Sheets

(56) References Cited

U.S. PATENT DOCUMENTS

| | | | | |
|---|---|---|---|---|
| 9,268,635 | B2 | 2/2016 | Sharon et al. | |
| 9,397,701 | B1 | 7/2016 | Micheloni et al. | |
| 9,419,655 | B2 | 8/2016 | Cai et al. | |
| 9,483,370 | B2 | 11/2016 | Reche et al. | |
| 9,529,672 | B2 | 12/2016 | Alam et al. | |
| 9,703,628 | B2 | 7/2017 | Han | |
| 2008/0123420 | A1 | 5/2008 | Brandman et al. | |
| 2008/0250300 | A1* | 10/2008 | Mokhlesi | G11C 16/28 714/780 |
| 2011/0209031 | A1* | 8/2011 | Kim | G11C 16/3404 714/763 |
| 2012/0311402 | A1 | 12/2012 | Tseng et al. | |
| 2013/0176778 | A1 | 7/2013 | Chen et al. | |
| 2013/0326314 | A1* | 12/2013 | Choi | H03M 13/45 714/780 |
| 2015/0169406 | A1 | 6/2015 | Li et al. | |
| 2016/0132256 | A1* | 5/2016 | Jung | G06F 11/00 711/103 |
| 2020/0004629 | A1* | 1/2020 | Zamir | G06F 3/0619 |

* cited by examiner

|     | S1 | S2 | S3 | S4 | S5 | S6 | S7 | S8 |
|-----|----|----|----|----|----|----|----|----|
| LSB | 1  | 0  | 0  | 0  | 0  | 1  | 1  | 1  |
| CSB | 1  | 1  | 0  | 0  | 1  | 1  | 0  | 0  |
| MSB | 1  | 1  | 1  | 0  | 0  | 0  | 0  | 1  |

MINF

| | | | | |
|---|---|---|---|---|
| | ST | WK | WK | ST |
| RDATA | 11 | 10 | 00 | 01 |
| LLR | +4L | +2L | −2L | −4L |

FIG. 12

| CELL | MC1 | MC2 | MC3 | MC4 | MC5 | MC6 | |
|---|---|---|---|---|---|---|---|
| PG1 | 0 (ST) | 1 (ST) | 0 (WK) | 1 (WK) | 0 (WK) | 0 (ST) | ← RB1 |
| PG2 | 0 (WK) | 1 (ST) | 1 (WK) | 0 (WK) | 0 (ST) | 1 (ST) | ← RB2 |
| PG3 | 0 (ST) | 0 (WK) | 1 (ST) | 0 (WK) | 1 (WK) | 0 (ST) | ← RB3 |
| RDST | S4 | S6 | S2 | S7 | S3 | S5 | |

FIG. 13

| CELL | MC1 | MC2 | MC3 | MC4 | MC5 | MC6 | |
|---|---|---|---|---|---|---|---|
| PG1 | -4L | 4L | -2L | 2L | -2L | -4L | ← LLR_SD1 |
| PG2 | -2L | 4L | 2L | -2L | -4L | 4L | ← LLR_SD2 |
| PG3 | -4L | -2L | 4L | -2L | 2L | -4L | ← LLR_SD3 |
| RDST | S4 | S6 | S2 | S7 | S3 | S5 | |

FIG. 16

| CELL | MC1 | MC2 | MC3 | MC4 | MC5 | MC6 | |
|---|---|---|---|---|---|---|---|
| PG1 | FR | NR | NR | FR | FR | NR | ← IRAINF1 |
| PG2 | NR | NR | NR | NR | NR | NR | ← IRAINF2 |
| PG3 | NR | FR | FR | NR | NR | FR | ← IRAINF3 |
| RDST | S4 | S6 | S2 | S7 | S3 | S5 | |

FIG. 17A

| CELL | MC1 | MC2 | MC3 | MC4 | MC5 | MC6 | |
|---|---|---|---|---|---|---|---|
| PG1 | -4L | 4L-D2 | -2L+D1 | 2L | -2L | -4L+D2 | LLR_A11 |
| PG2 | -2L+D1 | 4L-D2 | 2L-D1 | -2L+D1 | -4L+D2 | 4L-D2 | LLR_A12 |
| PG3 | -4L+D2 | -2L | 4L | -2L+D1 | 2L-D1 | -4L | LLR_A13 |
| RDST | S4 | S6 | S2 | S7 | S3 | S5 | |

FIG. 17B

| CELL | MC1 | MC2 | MC3 | MC4 | MC5 | MC6 | |
|---|---|---|---|---|---|---|---|
| PG1 | -4L-U2 | 4L | -2L | 2L+U1 | -2L-U1 | -4L | ← LLR_A21 |
| PG2 | -2L | 4L | 2L | -2L | -4L | 4L | ← LLR_A22 |
| PG3 | -4L | -2L-U1 | 4L+U2 | -2L | 2L | -4L-U2 | ← LLR_A23 |
| RDST | S4 | S6 | S2 | S7 | S3 | S5 | |

FIG. 17C

| CELL | MC1 | MC2 | MC3 | MC4 | MC5 | MC6 | |
|---|---|---|---|---|---|---|---|
| PG1 | -4L-U2 | 4L-D2 | -2L+D1 | 2L+U1 | -2L-U1 | -4L+D2 | ← LLR_A31 |
| PG2 | -2L+D1 | 4L-D2 | 2L-D1 | -2L+D1 | -4L+D2 | 4L-D2 | ← LLR_A32 |
| PG3 | -4L+D2 | -2L-U1 | 4L+U2 | -2L+D1 | 2L-D1 | -4L-U2 | ← LLR_A33 |
| RDST | S4 | S6 | S2 | S7 | S3 | S5 | |

FIG. 20

| CELL | MC1 | MC2 | MC3 | MC4 | MC5 | MC6 |
|---|---|---|---|---|---|---|
| PG3 (UPG) | MN | MN | MN | MN | UP | MN |
| RDST | S4 | S6 | S2 | S7 | S3 | S5 |

CRAINF3

FIG. 23

| CELL | MC1 | MC2 | MC3 | MC4 | MC5 | MC6 |
|---|---|---|---|---|---|---|
| PG3 (UPG) | MN | MN | MN | MN | DN | MN |
| RDST | S4 | S6 | S2 | S7 | S3 | S5 |

CRA INF3

3-bit Soft Decision Read

| | | | | | | |
|---|---|---|---|---|---|---|
| | ST | WK | VWK | VWK | WK | ST |
| RDATA → | 111 | 110 | 100 | 000 | 010 | 011 |
| LLR → | +5L | +3L | +L | −L | −3L | −5L |

FIG. 27

| CELL | MC1 | MC2 | MC3 | MC4 | MC5 | MC6 | |
|---|---|---|---|---|---|---|---|
| PG1 | 0 (ST) | 1 (WK) | 0 (WK) | 1 (VWK) | 0 (WK) | 0 (ST) | ← RB1 |
| PG2 | 0 (VWK) | 1 (ST) | 1 (ST) | 0 (WK) | 0 (WK) | 1 (ST) | ← RB2 |
| PG3 | 0 (ST) | 0 (VWK) | 1 (WK) | 0 (WK) | 1 (WK) | 0 (ST) | ← RB3 |
| RDST | S4 | S6 | S2 | S7 | S3 | S5 | |

FIG. 28

| CELL | MC1 | MC2 | MC3 | MC4 | MC5 | MC6 | |
|---|---|---|---|---|---|---|---|
| PG1 | -5L | 3L | -3L | L | -3L | -5L | ← LLR_SD1 |
| PG2 | -L | 5L | 5L | -3L | -3L | 5L | ← LLR_SD2 |
| PG3 | -5L | -L | 3L | -3L | L | -5L | ← LLR_SD3 |
| RDST | S4 | S6 | S2 | S7 | S3 | S5 | |

FIG. 29

| CELL | MC1 | MC2 | MC3 | MC4 | MC5 | MC6 | |
|---|---|---|---|---|---|---|---|
| PG1 | -5L-U2 | 3L-D2 | -3L+D1 | L+U1 | -3L-U1 | -5L+D2 | ← LLR_A31 |
| PG2 | -L+D1 | 5L-D2 | 5L-D1 | -3L+D1 | -3L+D2 | 5L-D2 | ← LLR_A32 |
| PG3 | -5L+D2 | -L-U1 | 3L+U2 | -3L+D1 | L-D1 | -5L-U2 | ← LLR_A33 |
| RDST | S4 | S6 | S2 | S7 | S3 | S5 | |

$$S_{3x5} = \begin{bmatrix} 2 & 3 & 110 & 142 & 165 \\ 5 & 64 & 96 & 113 & 144 \\ 7 & 50 & 75 & 116 & 174 \end{bmatrix}$$

ERROR CHECK CODE (ECC) DECODER AND MEMORY SYSTEM INCLUDING ECC DECODER

CROSS-REFERENCE TO RELATED APPLICATION

This U.S. non-provisional application claims priority under 35 USC § 119 to Korean Patent Application No. 10-2020-0074280, filed on Jun. 18, 2020, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to an error check code (ECC) decoder and/or a memory system including an ECC decoder.

2. Discussion of Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as the main memories of various apparatuses, while nonvolatile memory devices are widely used for storing program codes and/or data in various electronic devices, such as computers, mobile devices, etc.

Recently, nonvolatile memory devices with three-dimensional structures, such as vertical NAND memory devices, have been developed to increase integration and memory capacity of the nonvolatile memory devices. To increase memory capacity, a multi-level cell (MLC) scheme may be used such that a plurality of data bits are stored in each memory cell. In the MLC scheme, the number of states programmed in the memory cells increases, degeneration of memory cells increases, and operation speeds of the memory devices is decreases.

SUMMARY

Some example embodiments may provide an error check code (ECC) decoder and/or a memory system, capable of efficiently correcting errors in data read from a memory device.

According to example embodiments, an ECC decoder includes a buffer, a data converter and a decoding circuit. The buffer is configured to store a plurality of read pages read from a plurality of multi-level cells connected to a same wordline. The data converter is configured to adjust reliability parameters of read bits of the plurality of read pages, based on a state-bit mapping information and the plurality of read pages, to generate a plurality of ECC input data respectively corresponding to the plurality of read pages. The state-bit mapping information indicates mapping relationships between states and bits stored in the plurality of multi-level cells. The decoding circuit is configured to perform an ECC decoding operation with respect to the plurality of read pages based on the plurality of ECC input data.

According to example embodiments, an error correction code (ECC) decoder includes a buffer configured to store a plurality of read pages read from a plurality of multi-level cells connected to a same wordline; a state equalizer configured to generate a plurality of reliability adjustment information respectively corresponding to the plurality of read pages based on state-bit mapping information and the plurality of read pages, the state-bit mapping information indicating mapping relationships between states and bits stored in the plurality of multi-level cells; a log likelihood ratio (LLR) generator configured to generate a plurality of LLRs respectively corresponding to the plurality of read pages by adjusting reliability parameters of read bits of the plurality of read pages based on the plurality of read pages and the plurality of reliability adjustment information and a decoding circuit. The decoding circuit is configured to perform an initial decoding operation to correct errors per read page with respect to all of the plurality of read pages. The decoding circuit is configured to perform a re-decoding operation to, in response to an uncorrected page existing among the plurality of read pages after the initial decoding operation, to correct errors in the uncorrected page based on corrected pages among the plurality of read pages. The uncorrected page indicates a read page that is not error-corrected by the initial decoding operation. The corrected page indicates a read page that is error-corrected by the initial decoding operation.

According to example embodiments, a memory system includes a nonvolatile memory device including multi-level cells and a memory controller configured to control an operation of the nonvolatile memory device. The memory controller includes an error correction code (ECC) decoder configured to perform a ECC decoding operation with respect to dada read from the nonvolatile memory device. The ECC decoder includes a buffer, a data converter and a decoding circuit. The buffer is configured to store a plurality of read pages read from a plurality of multi-level cells connected to a same wordline. The data converter is configured to adjust reliability parameters of read bits of the plurality of read pages, based on a state-bit mapping information and the plurality of read pages, to generate a plurality of ECC input data respectively corresponding to the plurality of read pages. The state-bit mapping information indicates mapping relationships between states and bits stored in the plurality of multi-level cells. The decoding circuit is configured to perform an ECC decoding operation with respect to the plurality of read pages based on the plurality of ECC input data.

The ECC decoder according to example embodiments may increase an error correction probability by adjusting the reliability parameters of read bits based on the state-bit mapping information and performance of the ECC decoder and the memory system may be enhanced.

In addition, the ECC decoder may further increase the error correction probability by performing the re-decoding operation with respect to the uncorrected page based on the corrected pages, errors of which are corrected by the initial decoding operation.

BRIEF DESCRIPTION OF THE DRAWINGS

Example embodiments of the present disclosure will be more clearly understood from the following detailed description taken in conjunction with the accompanying drawings.

FIG. 12 is a diagram illustrating a plurality of read pages used in an error correction method according to example embodiments.

FIG. 13 is a diagram illustrating LLRs corresponding to the plurality of read pages of FIG. 12.

FIG. 16 is a diagram illustrating an example embodiment of an initial reliability adjustment information according to the reliability adjustment of FIG. 15.

FIGS. 17A, 17B and 17C are diagrams illustrating example embodiments of an LLR adjustment according to the initial reliability adjustment information of FIG. 16.

FIG. 20 is a diagram illustrating an example embodiment of a corrected reliability adjustment information according to the reliability adjustment of FIG. 19.

FIG. 23 is a diagram illustrating an example embodiment of a corrected reliability adjustment information according to the reliability adjustment of FIG. 22.

FIG. 27 is a diagram illustrating a plurality of read pages used in an error correction method according to example embodiments.

FIG. 28 is a diagram illustrating LLRs corresponding to the plurality of read pages of FIG. 27.

FIG. 29 is a diagram illustrating LLRs adjusted by a reliability adjustment for an error correction method according to example embodiments.

DETAILED DESCRIPTION OF THE EMBODIMENTS

Figure 1:
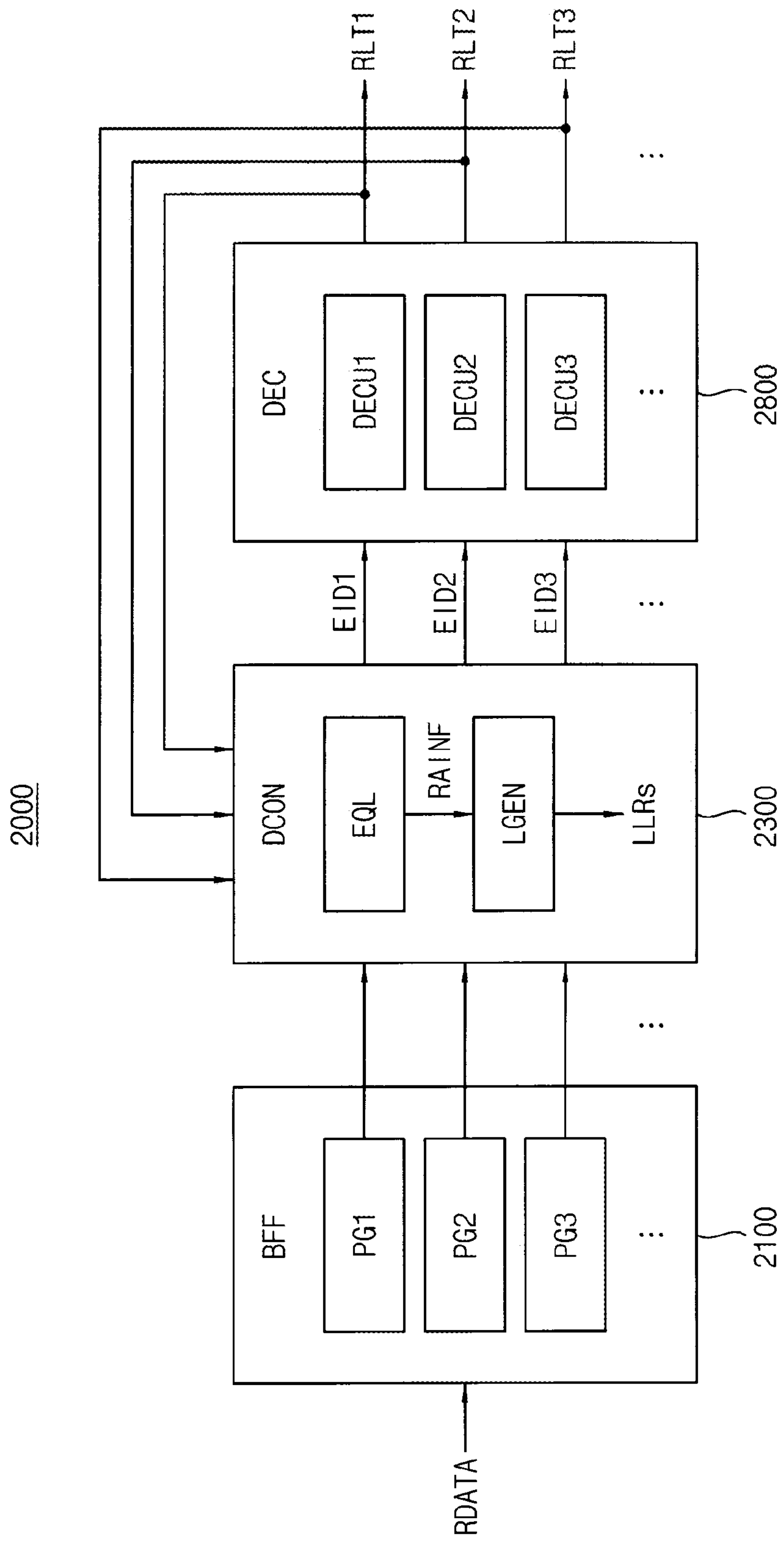
FIG. 1 is a block diagram illustrating an error check code (ECC) decoder according to example embodiments.

Various example embodiments will be described more fully hereinafter with reference to the accompanying drawings, in which some example embodiments are shown. In the drawings, like numerals refer to like elements throughout. The repeated descriptions may be omitted.

Figure 2:
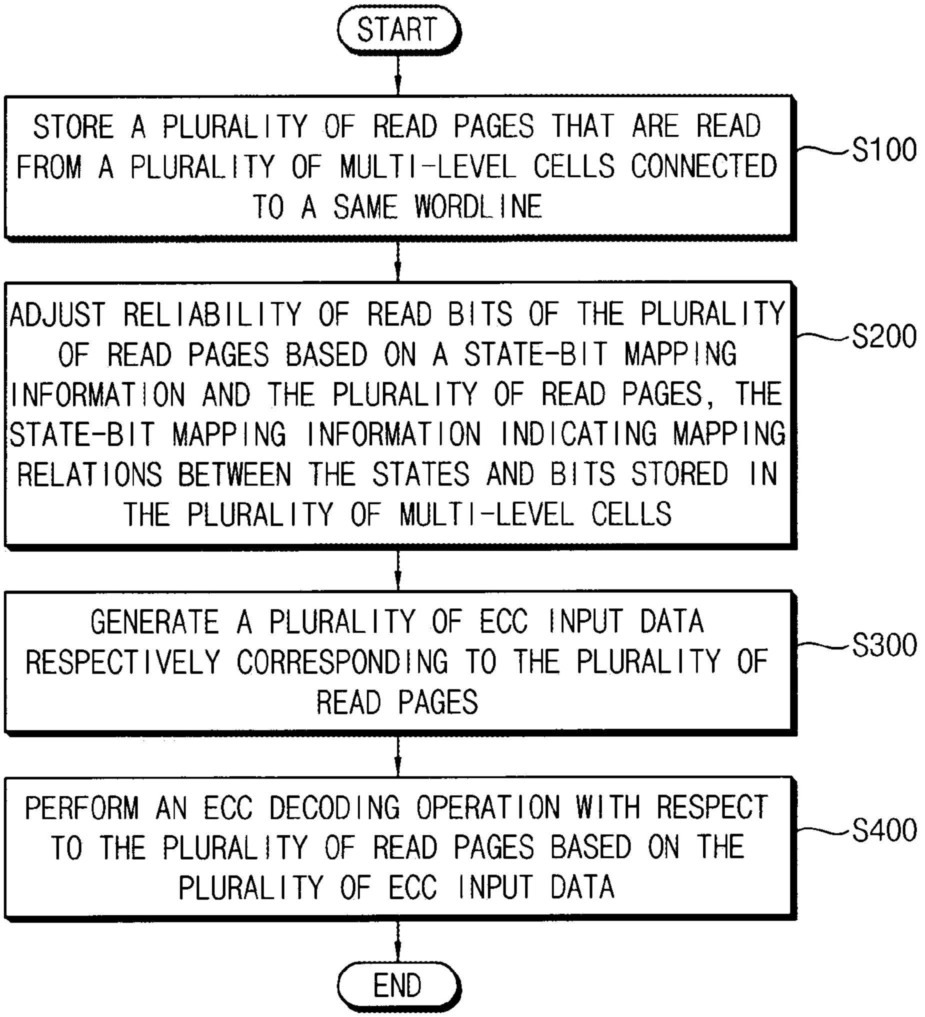
FIG. 2 is a flow chart illustrating an error correction method according to example embodiments.

FIG. 1 is a block diagram illustrating an error check code (ECC) decoder according to example embodiments, and FIG. 2 is a flow chart illustrating an error correction method according to example embodiments.

Referring to FIG. 1, an ECC decoder 2000 includes a buffer BFF 2100, a data converter DCON 2300 and a decoding circuit DEC 2800.

Referring to FIGS. 1 and 2, the buffer 2100 stores a plurality of read pages PG1, PG2 and PG3 read from a plurality of multi-level cells connected to a same wordline (S100). The plurality of read pages PG1, PG2 and PG3 may be included in read data RDATA read from a memory device. FIG. 1 illustrates three read pages for convenience of illustration and description, and the number of read pages to which an error correction method according to example embodiments may be varied depending on the number of bite stored in each multi-level cell.

The data converter 2300 adjusts reliability of read bits of the plurality of read pages PG1, PG2 and PG3 based on state-bit mapping information and the plurality of read pages PG1, PG2 and PG3, where the state-bit mapping information indicates mapping relationships between states and bits stored in the plurality of multi-level cells (S200). The state-bit mapping information will be described below with reference to FIG. 4.

In addition, the data converter 2300 may generate a plurality of ECC input data EID1, EID2 and EID3 respectively corresponding to the plurality of read pages PG1, PG2 and PG3 based on the plurality of read pages PG1, PG2 and PG3 and the reliability (S300).

The decoding circuit 2800 performs an ECC decoding operation with respect to the plurality of read pages PG1, PG2 and PG3 based on the plurality of ECC input data EID1, EID2 and EID3 (S400). In some example embodiments as illustrated in FIG. 1, the decoding circuit 2800 may include a plurality of decoding units DECU1, DECU2 and DECU3 to perform the ECC decoding operation in parallel with respect to the plurality of ECC input data EID1, EID2 and EID3. In this case, the plurality of decoding units DECU1, DECU2 and DECU3 may share at least a portion of decoding resources. In some example embodiments the decoding circuit 2800 may include decoding units such that the number of the decoding units is smaller than the number of the ECC input data EID1, EID2 and EID3, and at least two of the decoding units may perform the ECC decoding operation serially or sequentially with respect to at least two ECC input data.

In some example embodiments as illustrated in FIG. 1, the data converter 2300 may include a state equalizer EQL and an log likelihood ratio (LLR) generator LGEN.

The state equalizer EQL may generate a plurality of reliability adjustment information RAINF respectively corresponding to the plurality of read pages PG1, PG2 and PG3 based on the state-bit mapping information and the plurality of read pages PG1, PG2 and PG3.

The LLR generator LGEN may adjust reliability of read bits of the plurality of read pages PG1, PG2 and PG3 based on the plurality of read pages PG1, PG2 and PG3 and the plurality of reliability adjustment information RAINF. The LLR generator LGEN may generate, as the plurality of ECC input data EID1, EID2 and EID3, a plurality of LLRs respectively corresponding to the plurality of read pages PG1, PG2 and PG3 based on the adjusted reliability.

In some example embodiments the decoding circuit 2800 may provide decoding results RLT1, RLT2 and RLT3 of the plurality of read pages PG1, PG2 and PG3 to the data converter 2300. As will be described with reference to FIG. 9, the decoding circuit 2800 may perform an initial decoding operation and a re-decoding operation. The data converter 2300 may perform the re-decoding operation based on the results RLT1, RLT2 and RLT3 of the initial decoding operation to correct errors of an uncorrected page among the plurality of read pages PG1, PG2 and PG3. The uncorrected page indicates a read page that is not error-corrected by the initial decoding operation.

As such, the ECC decoder 2000 according to example embodiments may increase an error correction probability by adjusting reliability of the read bits based on the state-bit mapping information and performance of the ECC decoder and the memory system may be enhanced. In addition, the ECC decoder 2000 may further increase the error correction probability by performing the re-decoding operation with respect to the uncorrected page based on the corrected pages, errors of which are corrected by the initial decoding operation.

Figure 3:
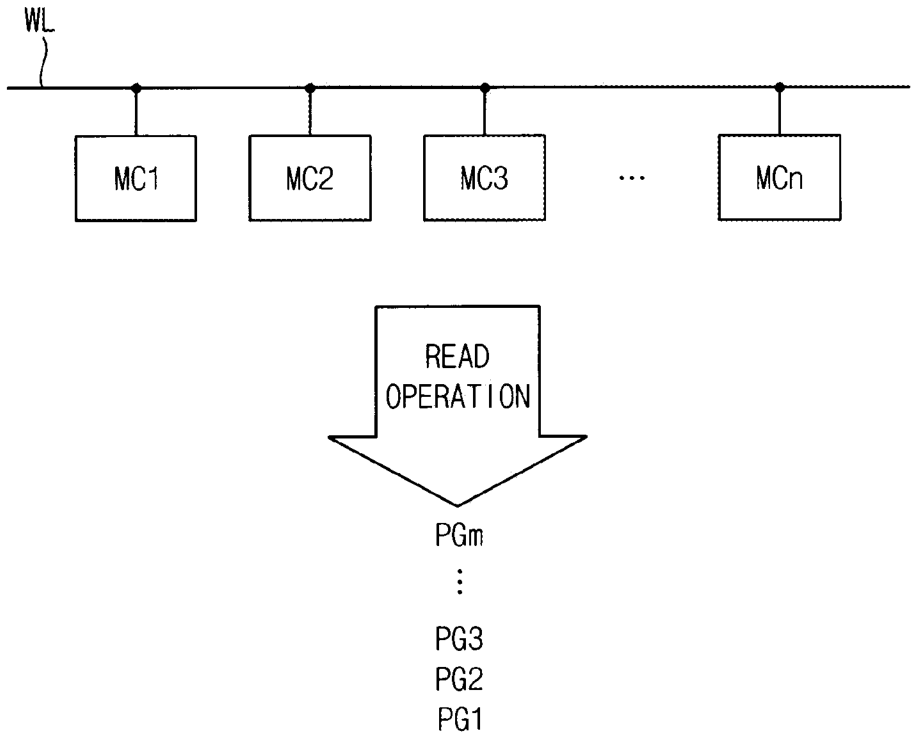
FIG. 3 is a diagram for describing read pages for an error correction method according to example embodiments.

FIG. 3 is a diagram for describing read pages for an error correction method according to example embodiments.

Referring to FIG. 3, a plurality of memory cells MC1~MCn corresponding to a page size of n may be commonly connected to a same wordline WL. The plurality of memory cells MC1~MCn may be selected simultaneously by enabling the wordline WL, which may be a unit of a read operation and a write operation.

The plurality of memory cells MC1~MCn may be multi-level cells such that each memory cell may be programed into one of $2^m$ states to store m-bit data, where m may be an integer greater than 1 (e.g., 2 or 3, but not limited thereto). Hereinafter, a memory cell may be considered as a multi-level cell (MLC) if it is not mentioned particularly.

Each MLC may store the m bits pertaining to different pages, and the m bits stored in each MLC corresponds to one state according to the state-bit mapping information as will be described with reference to FIGS. 4 and 5. The information of the m bits stored in each MLC may be referred to as longitudinal information or intra-cell information.

The plurality of memory cells MC1~MCn may store m pages PG1~PGm such that each of the m pages PG1~PGm includes n bits. Each of the m pages corresponds to a codeword that is encoded by a corresponding ECC scheme. The information of the n bits of each page according to the ECC scheme may be referred to as transversal information or inter-cell information.

The error correction method according to example embodiments may increase the error correction probability or the decoding success probability without the additional read operation, using both of the longitudinal information and the transversal information.

The plurality of read pages PG1~PGm stored in the plurality of memory cells MC1~MCn may be the codewords that are encoded by the same ECC scheme or at least two of the plurality of read pages PG1~PGm may be the codewords that are encoded by the different ECC schemes. In other words, the error correction method according to example embodiments does not require that the plurality of pages PG1~PGm should correspond to the identical ECC scheme.

Figure 4:
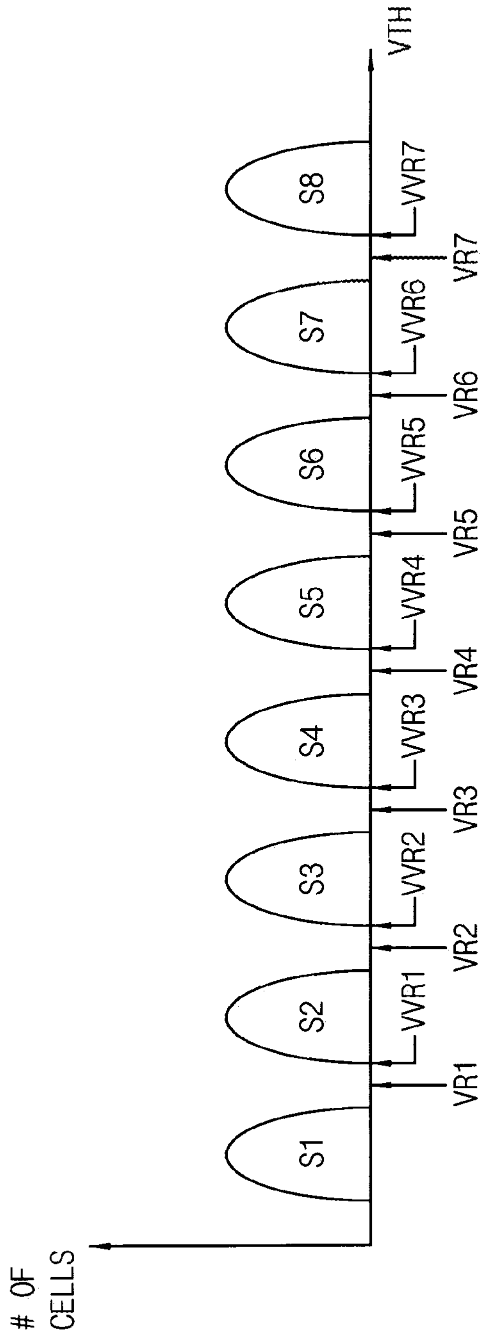
FIG. 4 is a diagram illustrating states of multi-level cells included in a nonvolatile memory device according to example embodiments.

FIG. 4 is a diagram illustrating states of multi-level cells included in a nonvolatile memory device according to example embodiments.

In FIG. 4, the horizontal axis represents a threshold voltage of a memory cell and the vertical axis represents the number of memory cells corresponding to the threshold voltage. During the program operation, the program success of the first through eighth states S1~S8 may be distinguished by sequentially applying first through seventh verification read voltage VVR1~VVR7 to the selected word line. In addition, during the normal read operation, the first through eighth states S1~S8 may be distinguished by applying at least a portion of first through seventh normal read voltages VR1~VR7 to the selected word line as will be described below with reference to FIG. 6. Hereinafter, a read voltage may be considered as a normal read voltage, which is differentiated from a verification read voltage, if it is not mentioned particularly.

Figure 5:
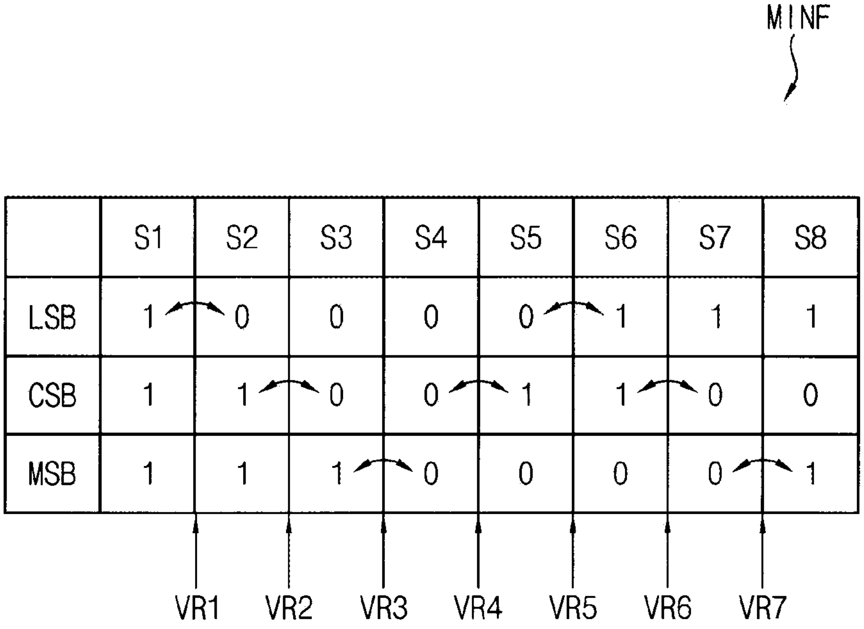
FIG. 5 is a diagram illustrating an example of state-bit mapping information indication mapping relationship between the states in FIG. 4 and bit values.
Figure 6:
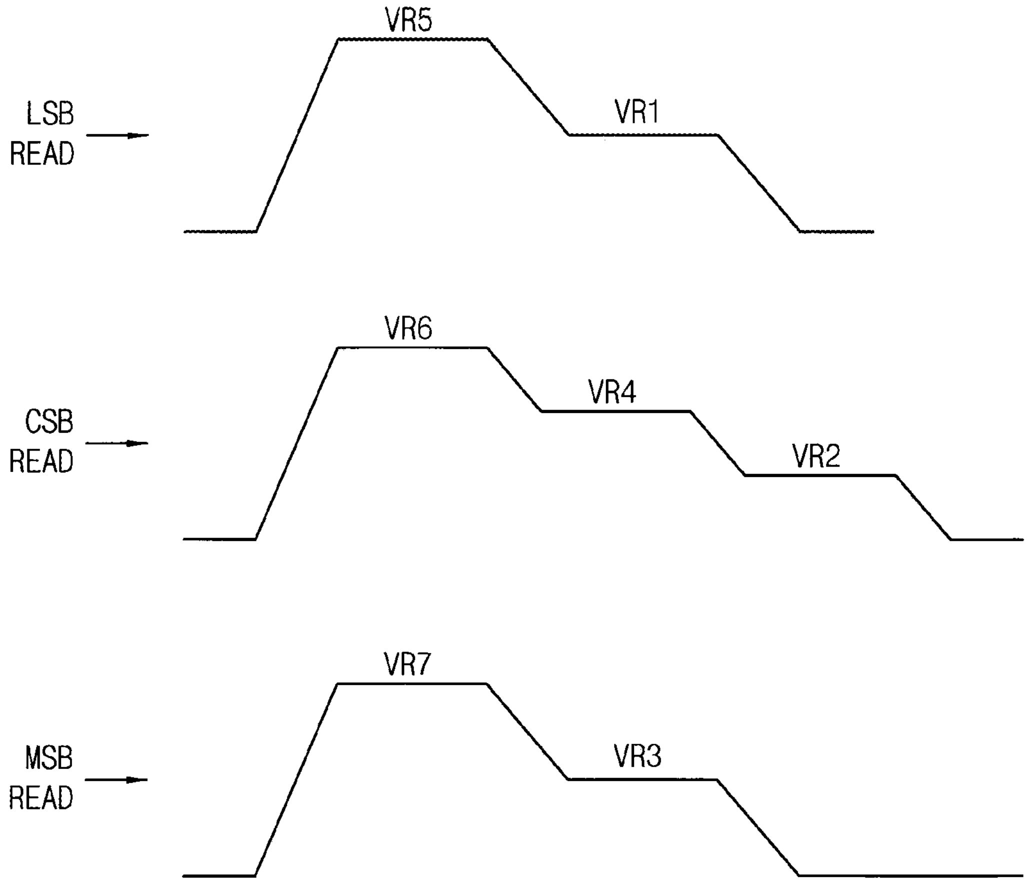
FIG. 6 is a diagram illustrating a read operation corresponding to the state-bit mapping information of FIG. 5.

FIG. 5 is a diagram illustrating an example of state-bit mapping information indication mapping relationship between the states in FIG. 4 and bit values, and FIG. 6 is a diagram illustrating a read operation corresponding to the state-bit mapping information of FIG. 5.

Referring to FIG. 5, the state-bit mapping information MINF may indicate the mapping relationships between the states and the bits stored in the plurality of multi-level cells. FIG. 5 illustrates an example of bit values corresponding to the first through eighth states S1~S8 in FIG. 4. The first through eighth states S1~S8 may be represented by different values corresponding to least significant bit (LSB), a centered bit (CSB) and a most significant bit (MSB), that is, different values of first, second and third bits LSB, CSB and MSB. For example, as illustrated in FIG. 5, the first state S1 corresponds to '111', the second state S2 corresponds to '110', the third state S3 corresponds to '100', the fourth state S4 corresponds to '000', the fifth S5 state corresponds to '010', the sixth S6 state corresponds to '011', the seventh state S7 corresponds to '001', and the eighth state S8 corresponds to '101'. According to example embodiments, each reliability of the read bits may be adjusted based on the state-bit mapping information MINF.

In this case, the first bit LSB may be determined using the first read voltage VR1 and the fifth read voltage VR5, the second bit CSB may be determined using the second read voltage VR2, the fourth read voltage V4 and the sixth read voltage VR6, and the third bit MSB may be determined using the third read voltage VR3 and the seventh read voltage VR7.

FIG. 6 illustrates a high-to-low read sequence corresponding to the example of FIG. 5.

In case of reading the first bit LSB, the fifth read voltage VR5 may be applied to the selected word line for the first sensing operation and the first read voltage VR1 may be applied to the selected word line. In case of reading the second bit CSB, the sixth read voltage VR6, the fourth read voltage VR4 and the second read voltage VR2 may be applied sequentially to the selected word line. In case of reading the third bit MSB, the seventh read voltage VR7 and the third read voltage VR3 may be applied sequentially to the selected word line.

Figure 7:
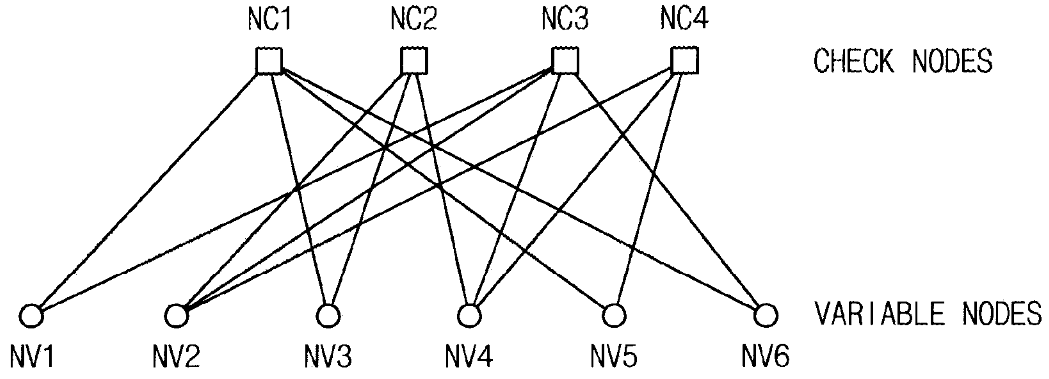
FIG. 7 is a diagram for describing a low density parity check (LDPC) code for an error correction method according to example embodiments.

FIG. 7 is a diagram for describing a low density parity check (LDPC) code for an error correction method according to example embodiments.

An LDPC code has an error correction capability near a channel capacity and is widely used in communication systems, communication standards, memory controllers, etc. The LDPC code is a linear block code that may be defined as a parity check matrix (PCM). Here, the definition of a code may be a relation between information and parity.

FIG. 7 shows an example of a Tanner graph. The Tanner graph includes variable nodes, check nodes and edges connecting the variable nodes and the check nodes. The variable nodes are related with codeword bits and the check nodes are related with parity check constraints. The component "1" of the PCM corresponds to an edge of the Tanner graph. The number of the edges connected to each node is defined as a degree of the node.

Figure 8:
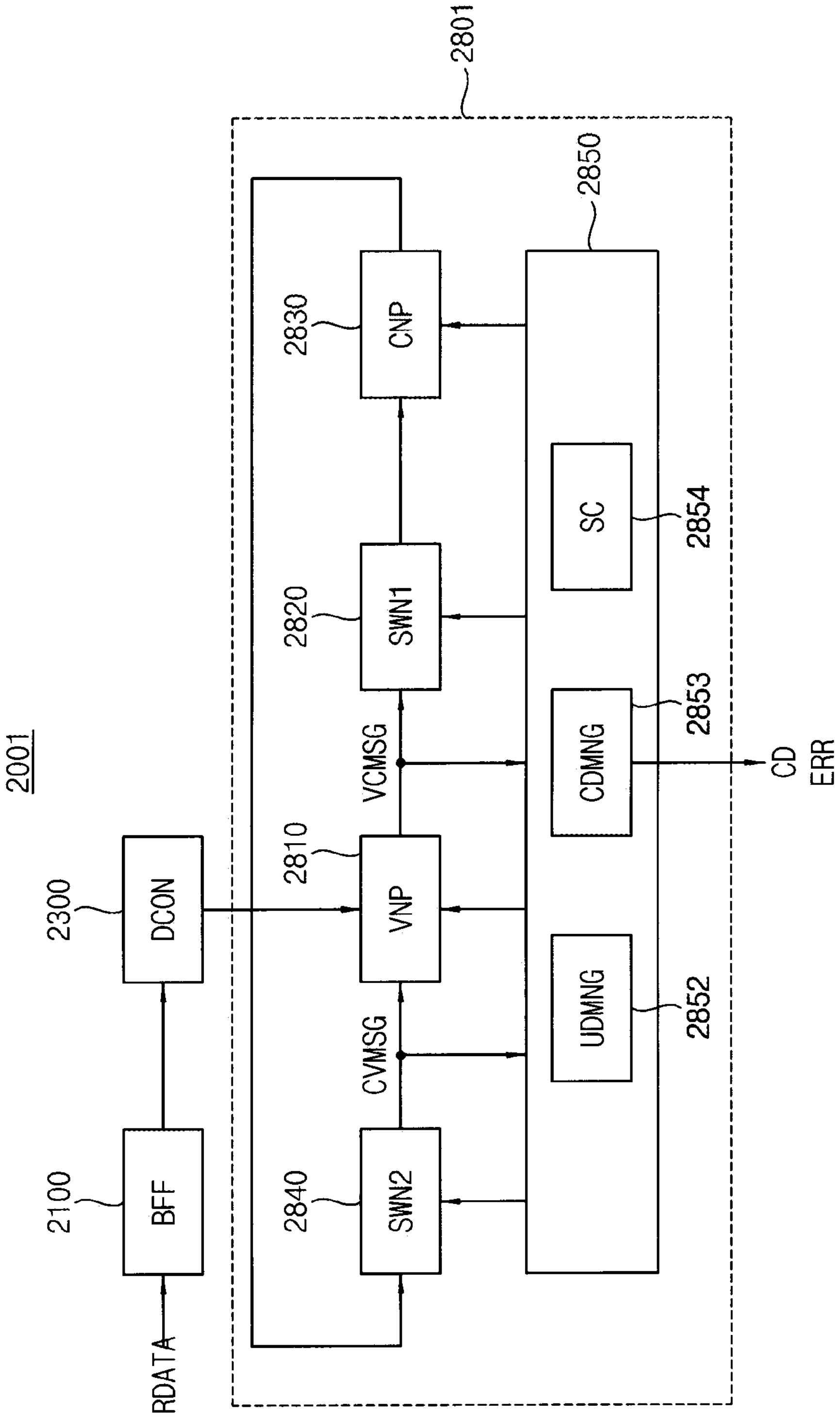
FIG. 8 is a block diagram illustrating an ECC decoder according to example embodiments.

FIG. 8 is a block diagram illustrating an ECC decoder according to example embodiments.

Referring to FIG. 8, an ECC decoder 2001 may include a buffer BFF 2100, a data converter DCON 2300 and a decoding circuit 2801.

The buffer 2100 may store read data RDATA read from a memory device. As described above, the buffer 2100 may store a plurality of read pages read from a plurality of multi-level cells connected to a same wordline. The read data RDATA may include hard decision data and soft decision data.

When a hard decision is conducted, the buffer 2100 receives the hard decision data that are read using a normal read voltage from the memory device and stores the received data. The stored data may be provided to the data converter 2300 for the decoding operation. When a soft decision is conducted, the buffer 2100 receives the soft decision data that are read using a partial read voltage from the memory device in addition to the hard decision data and stores the received data. The partial read voltage means a voltage that is proximate to the normal read voltage but has a different voltage level than the normal read voltage. The hard decision data and the soft decision data stored in the buffer 2100 may be provided to the data converter 2300 for the decoding operation. The hard decision data and the soft decision data will be further described with reference to FIGS. 10 through 25.

The data converter 2300 may be configured to map the LLR values to the provided read data. In some example embodiments, the data converter 2300 may include a hard decision LLR register (not shown) storing LLR values to be mapped during a hard decision and a soft decision LLR register (not shown) storing LLR values to be mapped during the soft decision.

During the hard decision, the data converter 2300 receives the hard decision data from the buffer 2100. The data converter 2300 maps the hard decision data with corresponding LLR values according to each bit value of the hard decision data. During the soft decision, the data converter 2300 receives the hard decision data and the soft decision data from the buffer 2100. The data converter 2300 maps the hard decision data with corresponding LLR values according to each bit value of the soft decision data. During the hard decision or the soft decision, a result of the mapping carried out by the data converter 2300 is output to the decoding circuit 2800 as LLR data.

The decoding circuit 2801 performs LDPC decoding on the received LLR data. During the hard decision and the soft decision, respective LLR data may be LDPC-decoded using the same method and device. The decoding circuit 2801 updates check nodes and variable nodes according to a parity check matrix during the LDPC decoding. The decoding circuit 2801 performs provisional decoding according to a result of the update (e.g., posteriori probability) and computes the provisionally decoded data and the parity check matrix to determine whether decoding is correctly performed according to a result of the computation.

For example, if the result of computation with the parity check matrix is a zero matrix, it is determined that the decoding is correctly performed. If not a zero matrix, it is determined that the decoding is not correctly performed. If the decoding is correctly performed, the decoding circuit 2801 outputs the decoded data as decoded data CD. If the decoding is not correctly performed (e.g., all errors of the read data are not corrected), the decoding circuit 2801 re-updates the check nodes and the variable nodes.

The above update and provisional decoding of check nodes and variable nodes are iteratively performed. The update and provisional decoding of check nodes and variable nodes may constitute a single decoding loop, that is, a decoding iteration.

When the hard decision is conducted in the decoding circuit 2801 and parity check based on the hard decision is failed, the decoding circuit 2801 transmits a fail message ERR.

The decoding circuit 2801 may include a variable node processor VNP 2810, a first switch network SWN1 2820, a check node processor CNP 2830, a second switch network SWN2 2840, and a controller 2850. The controller 2850 may include an update manager UDMNG 2852, a corrected data manager CDMNG 2853 and a syndrome checker SC 2854.

During the LDPC decoding, a nonzero element in the parity check matrix means that a corresponding variable node and a corresponding check node are connected to each other. The decoding is performed through data transmitted according to the connection of the variable node and the check node.

The variable node processor 2810 stores the provided LLR data from the data converter 2300 and provides the stored LLR data, as a variable node message VCMSG, to the check node processor 2830 through the first switch network 2820.

The check node processor 2830 compares values of variable nodes with respect to each check node with reference to the provided variable node message VCMSG to provide a check node message CVMSG. The check node message CVMSG provided to the variable node processor 2810 through the second switch network 2840.

The variable node processor 2810 updates values of the variable and check nodes with reference to the received check node message CVMSG. The variable node processor 2810 performs decoding according to the updated values of the variable and check nodes. A result of the decoding is provided to the corrected data manager 2853 as decoding data.

The corrected data manager 2853 stores the result of the decoding performed in the variable node processor 2810 and outputs the corrected data CD or a read error message ERR to an external device depending on whether decoding of the syndrome checker 2854 is successfully performed.

The syndrome checker 2854 determines whether the decoding is successfully performed, according to the decoding data stored in the corrected data manager 2853. For example, the syndrome checker 2854 multiplies the decoding data by a transpose matrix of the parity check matrix and determines whether the decoding is successfully performed (or whether all errors are corrected) depending on whether a result of the multiplication is a zero matrix. The syndrome checker 2854 provides a result of the determination to the corrected data manager 2853. The update manager 2852 may update decoding schedule of the decoding circuit 2801. The update manager 2852 may update a next decoding iteration based on a decoding result of a previous decoding iteration.

Figure 9:
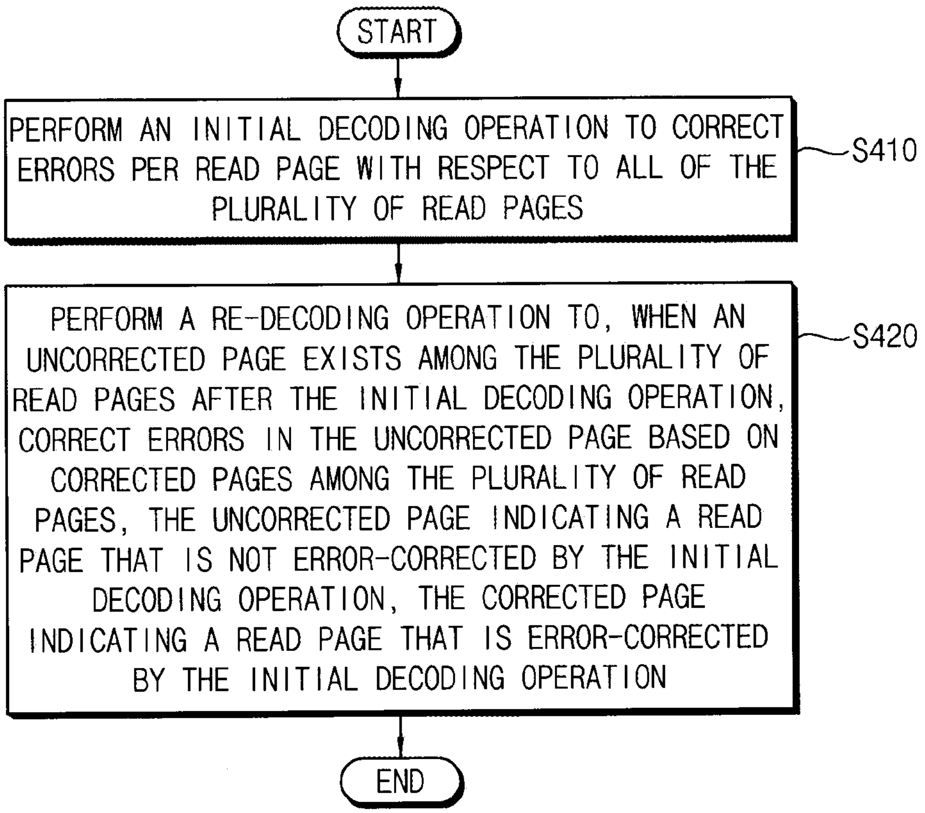
FIG. 9 is a flow chart illustrating an example embodiment of an operation of an ECC decoder according to example embodiments.

FIG. 9 is a flow chart illustrating an example embodiment of an operation of an ECC decoder according to example embodiments.

Referring to FIGS. 1 and 9, the ECC decoder 2000 may perform an initial decoding operation to correct errors per read page with respect to all of the plurality of read pages PG1, PG2 and PG3 (S410). In addition, the ECC decoder 2000 may perform a re-decoding operation to, when (and/or in response to) an uncorrected page exists among the plurality of read pages PG1 and PG2 and PG3 after the initial decoding operation, correct errors in the uncorrected page based on corrected pages among the plurality of read pages PG1, PG2 and PG3, where the uncorrected page indicates a read page that is not error-corrected by the initial decoding operation and the corrected page indicates a read page that is error-corrected by the initial decoding operation (S420).

In some example embodiments as will be described with reference to FIGS. 14 through 17C, the data converter 2300 may adjust reliability of the read bits based on the plurality of read pages PG1, PG2 and PG3 and the state-bit mapping information MINF to generate each bit of the plurality of ECC input data EID1, EID2 and EID3 for the initial decoding operation.

In some example embodiments as will be described with reference to FIGS. 18 through 24, the data converter 2300 may adjust reliability of the read bits of the uncorrected page based on the plurality of read pages PG1, PG2 and PG3, the state-bit mapping information MINF and the decoding results RLT1, RLT2 and RLT3 to generate each bit of the ECC input data corresponding to the uncorrected page for the re-decoding operation.

Figures 10, 11:
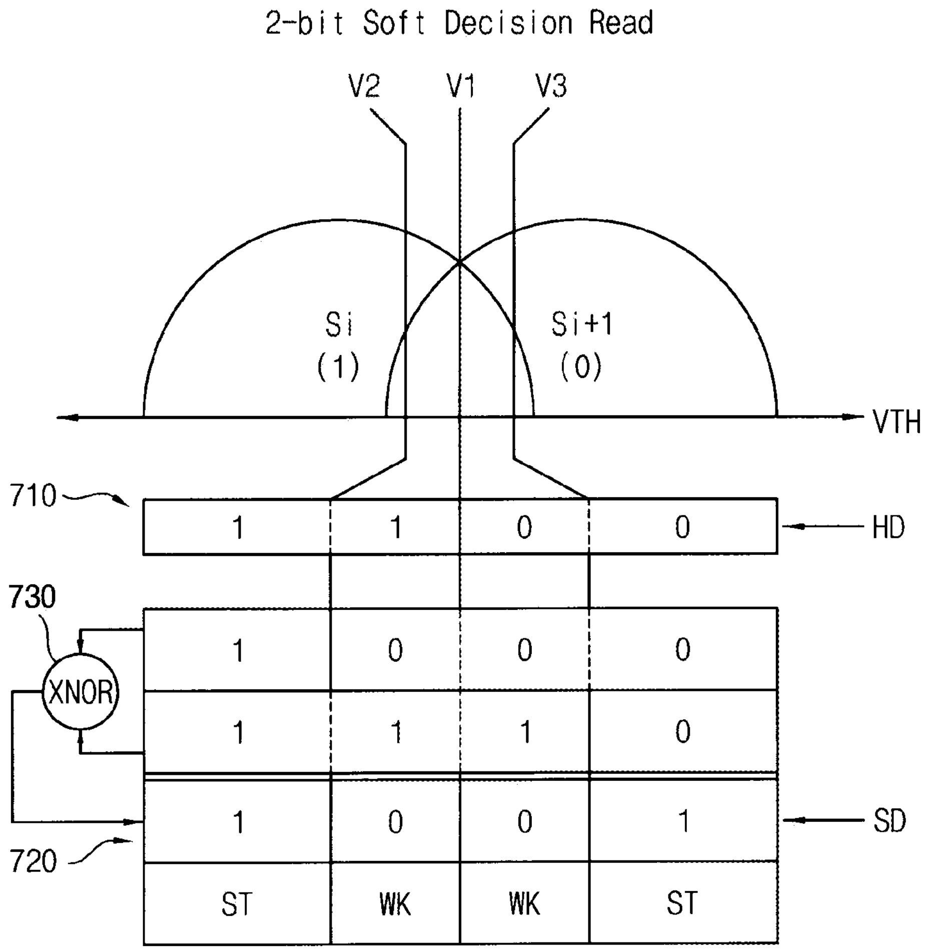
FIG. 10 is a diagram illustrating an example of a 2-bit soft decision read operation of a nonvolatile memory device included in a memory system according to example embodiments.
FIG. 11 is a diagram illustrating an example of a log likelihood ratio (LLR) corresponding to the 2-bit soft decision read operation of FIG. 10.

FIG. 10 is a diagram illustrating an example of a 2-bit soft decision read operation of a nonvolatile memory device included in a memory system according to example embodiments.

Referring to FIG. 10, the threshold voltages VTH of the memory cells may be changed due to various factors and thus the two adjacent states Si and Si+1 or the two adjacent threshold voltage distributions Si and Si+1 may be superimposed. The change of the threshold voltages VTH may be caused by interference between the memory cells, program disturbance, read disturbance, charge leakage, etc.

As illustrated in FIG. 10, the nonvolatile memory device may perform a 2-bit soft decision read operation. The 2-bit soft decision read operation may include three read operations using three voltages V1, V2 and V3 having regular intervals. For example, the three voltages V1, V2 and V3 may include a first voltage V1 having a desired and/or alternatively predetermined reference level for distinguishing between a first state Si corresponding to data '1' and a second state Si+1 corresponding to data '0', a second voltage V2 lower by a desired and/or alternatively predetermined level than the first voltage V1, and a third voltage V3 higher by the desired and/or alternatively predetermined level than the first voltage V1. In some example embodiments, data 710 read by using the first voltage V1 having the reference level may be hard decision data (HD) 710 read by a hard decision read operation, and the 2-bit soft decision read operation may use the hard decision data 710 read by the hard decision read operation without applying the first voltage V1 having the reference level. The 2-bit soft decision read operation may generate soft decision data (SD) 720 having reliability information for the hard decision data 710 by performing a desired and/or alternatively predetermined logical operation (e.g., an XNOR operation 730) (or encoding) on data read by using the second voltage V2 and data read by using the third voltage V3. Each bit of the soft decision data 720 may represent a degree of reliability of a corresponding bit of the hard decision data 710. For example, a bit of the soft decision data 720 having a value of '1' may represent that a corresponding bit of the hard decision data 710 has strong (ST) reliability, and a bit of the soft decision data 720 having a value of '0' may represent that a corresponding bit of the hard decision data 710 has weak (WK) reliability.

FIG. 11 is a diagram illustrating an example of a log likelihood ratio (LLR) corresponding to the 2-bit soft decision read operation of FIG. 10.

Referring to FIG. 11, the first bit of the read data RDATA may correspond to the hard decision data and the second bit of the read data RDATA may correspond to the soft decision data. The hard decision data may be the read bit and the soft decision data may indicate the reliability. As described with reference to FIG. 10, a bit of the soft decision data having a value of '1' may represent that a corresponding bit of the hard decision data has strong (ST) reliability, and a bit of the soft decision data having a value of '0' may represent that a corresponding bit of the hard decision data has weak (WK) reliability.

The LLR generator LGEN included in the data converter 2300 may generate a plurality of LLRs respectively corresponding to the plurality of read pages PG1, PG2 and PG3 based on the read bits and the corresponding reliability.

For example, the LLR may be defined as Expression 1. The definition of the LLR is not limited to Expression 1 and the LLR may be defined by the different method.

$$LLR(Y)=C*\log\{P(Y|X=1)/P(Y|X=0)\} \quad \text{Expression 1}$$

In Expression 1, Y indicates a read bit that is read from a memory cell, X indicates a write bit that has been programmed or written in the memory cell, and C indicates a normalization constant. As a result, the positive value of the LLR may represent that the read bit may be 1 with a higher probability than 0. In contrast, the negative value of the LLR may represent that the read bit may be 0 with a higher probability than 1.

FIG. 11 illustrates an example of mapping between the read data RDATA and the LLR. In FIG. 11, L indicates a positive value which may be set to a proper value according to a decoding scheme. The LLR of +4L indicates the bit value of 1 with ST reliability, the LLR of +2L indicates the bit value of 1 with WK reliability, LLR of −4L indicates the bit value of 0 with ST reliability, and the LLR of −2L indicates the bit value of 0 with WK reliability. The mapping of FIG. 11 is just an example, and example embodiments are limited thereto.

FIG. 12 is a diagram illustrating a plurality of read pages used in an error correction method according to example embodiments, and FIG. 13 is a diagram illustrating LLRs corresponding to the plurality of read pages of FIG. 12.

FIG. 12 illustrates first through third read pages PG1, PG2 and PG3 read from first through sixth memory cells MC1~MC6 of FIG. 12, as an example. For example, the first read page PG1 may correspond to the least significant bit (LSB), the second read page PG2 may correspond to the center bit (CSB), and the third read page PG3 may correspond to the most significant bit (MSB). As described with reference to FIG. 10, the first through third read pages PG1, PG2 and PG3 may include first through third read bits RB1~RB3 corresponding to the hard decision data and the reliability WK or ST of the corresponding bit.

Referring to FIGS. 1 and 13, the LLR generator LGEN may generate the first LLR LLR_SD1 corresponding to the first read page PG1, the second LLR LLR_SD2 corresponding to the second read page PG2 and the third LLR LLR_SD3 corresponding the third page PG3 based on the soft decision data indicating the reliability WK or ST, respectively.

The state equalizer EQL may determine a read state RDST corresponding to each of the first through sixth memory cells MC1~MC6, for example, using the state-bit mapping information MINF of FIG. 5. As illustrated in FIGS. 12 and 13, the first memory cell MC1 corresponds to the fourth state S4, the second memory cell MC2 corresponds to the sixth state S6, the third memory cell MC3 corresponds to second state S2, the fourth memory cell MC4 corresponds to the seventh state S7, the first memory cell MC6 corresponds to the third state S3 and the sixth memory cell corresponds to the fifth state S5.

According to example embodiments, the state equalizer EQL may adjust the reliability of the read bits based on the longitudinal information, that is, the state-bit mapping information MINF, and the LLR generator LGEN may increase or decrease the LLRS based on the adjusted reliability. Hereinafter, example embodiments of reliability adjustment and LLR adjustment are described with reference to the example read pages of FIG. 12 and the example LLRS of FIG. 13. The reliability adjustment and the LLR adjustment may be performed with respect to each of the initial decoding operation and the re-decoding operation as described with reference to FIG. 9. The reliability adjustment and the LLR adjustment in the initial decoding operation will be described with reference to FIGS. 14 through 17C and the reliability adjustment and the LLR adjustment will be described with reference to FIGS. 18 through 24.

Figure 14:
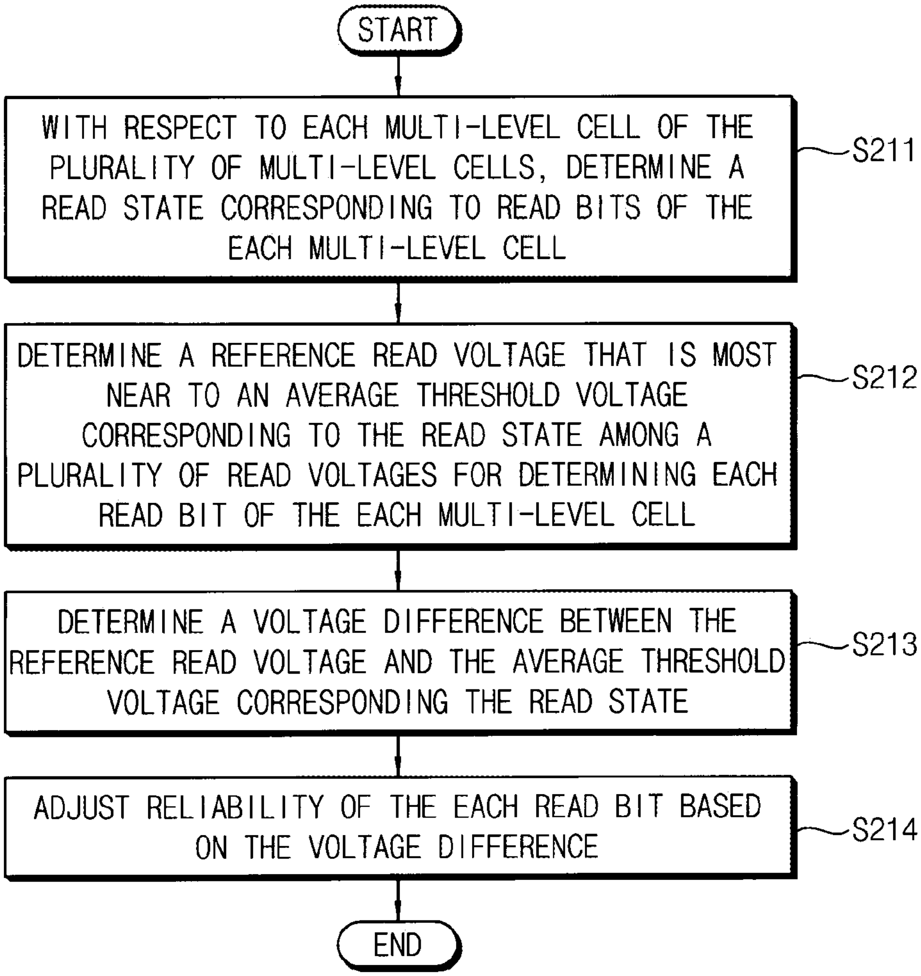
FIG. 14 is a flow chart illustrating an example embodiment of a reliability adjustment in an initial decoding operation for an error correction method according to example embodiments.

FIG. 14 is a flow chart illustrating an example embodiment of a reliability adjustment in an initial decoding operation for an error correction method according to example embodiments.

Referring to FIGS. 1, 12, 13 and 14, the state equalizer EQL may, with respect to each multi-level cell MCi (i=1~6) of the plurality of multi-level cells MC1~MC6, determine a read state RDST corresponding to read bits of the each multi-level cell MCi (S211). Here, the read bits of the each multi-level cell MCi indicates the three read bits respectively corresponding to the first through third read pages PG1, PG2 and PG3.

The state equalizer EQL may determine a reference read voltage that is nearest to an average threshold voltage corresponding to the read state RDST among a plurality of read voltages for determining each read bit of the each multi-level cell MCi (S212). Here, the each read bit of the each multi-level cell MCi indicates any one of the three read bits respectively corresponding to the first through third read pages PG1, PG2 and PG3.

The state equalizer EQL may determine a voltage difference between the reference read voltage and the average threshold voltage corresponding the read state RDST (S213). For example, the average threshold voltage corresponding to the read state RDST may be estimated or calculated through the relations between the read voltages and/or the program voltages.

The state equalizer EQL may adjust reliability of the each read bit of the each multi-level cell MCi based on the voltage difference (S214).

Figure 15:
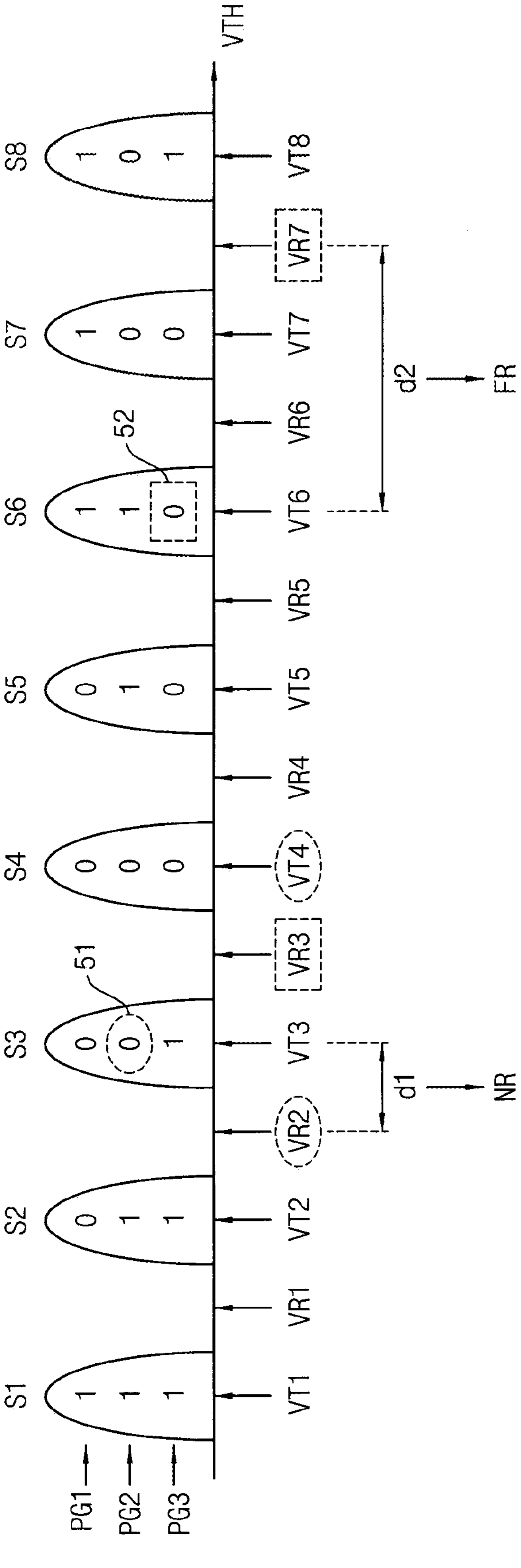
FIG. 15 is a diagram for describing an example embodiment of a reliability adjustment in an initial decoding operation.

FIG. 15 is a diagram for describing an example embodiment of a reliability adjustment in an initial decoding operation, and FIG. 16 is a diagram illustrating an example embodiment of an initial reliability adjustment information according to the reliability adjustment of FIG. 15.

FIG. 15 illustrates an example of the reliability adjustment with respect to the fifth memory cell MC5, the read state RDST of which corresponds to the third state S3, and the second memory cell MC2 the RDST of which corresponds to the sixth state S6 as illustrated in FIG. 12. In FIG. 15, VR1~VR7 indicate the first through seventh read voltages corresponding to the state-bit mapping information MINF of IG. 5, and VT1~VT8 indicate the average threshold voltages corresponding to the first through eighth states S1~S8.

Referring to FIGS. 14 and 15, the read voltages to determine the read bit 51 in the second read page PG2 of the fifth memory cell MC5 correspond to the second and fourth read voltages VR2 and VR4 as illustrated in the state-bit mapping information MINF of FIG. 5. Among the second and fourth read voltages VR2 and VR4, the third average threshold voltage VT3 of the third state S3 is nearest to the second read voltage VR2, which corresponds to a reference voltage; as a result, a first voltage difference d1 between the reference voltage and the third average threshold voltage VT3 corresponding to the read state RDST of the fifth memory cell MC5 may be determined.

The read voltages to determine the read bit 52 in the third read page PG3 of the second memory cell MC2 correspond to the third and seventh read voltages VR3 and VR7 as illustrated in the state-bit mapping information MINF of FIG. 5. Among the third and seventh read voltages VR3 and VR7, the sixth average threshold voltage VT6 of the sixth state S6 is nearest to the seventh read voltage VR7, which corresponds to the reference voltage; as a result, a second voltage difference d2 between the reference voltage and the sixth average threshold voltage VT6 corresponding to the read state RDST of the second memory cell MC2 may be determined.

The state equalizer EQL may adjust the reliability (also referred to as reliability indicator or reliability parameter) of the read bits based on the voltage differences. A first information value NR may be assigned to the second read page PG2 of the fifth memory cell MC5 corresponding to the first voltage difference d1 of a relatively small value (e.g., a voltage difference that is less than average threshold voltages between two adjacent program states, such as for example how d1 is less than the difference between VT2 and VT3 in FIG. 15), and a second information value FR may be assigned to the third read page PG3 of the second memory cell MC2 corresponding to the second voltage difference d2 of a relatively great value (e.g., a voltage difference that is greater than average threshold voltages between two adjacent program states, such as for example how d2 is greater than the difference between VT6 and VT7 in FIG. 15). The state equalizer EQL may assign the first information value NR or the second information value FR to all of the read bits in the same way as described with reference to FIG. 15, to generate initial reliability adjustment information. The initial reliability adjustment information may include first through initial reliability adjustment information IRAINF1~IRAINF3 respectively corresponding to the first through read pages PG1, PG2 and PG3.

FIGS. 17A, 17B and 17C are diagrams illustrating example embodiments of an LLR adjustment according to the initial reliability adjustment information of FIG. 16.

The LLR generator LGEN may generate a plurality of LLRs respectively corresponding to a plurality of read pages based on the initial reliability adjustment information as described with reference to FIG. 16.

In general, the probability that the read bit is different from the write bit is increased as the read state approach near the read voltage. In other words, the first information value NR may indicate decrease of reliability and the second information value FR may indicate increase of reliability. Accordingly, the LLRs may be adjusted such that the reliability of the read bits may be decreased as the second read page PG2 of the fifth memory cell MC5 having the first information value NR and the reliability of the read bits may be increased as the third read page PG3 of the second memory cell MC2 having the second information value FR.

FIGS. 17A, 17B and 17C illustrate the results of adjusting the LLRs of FIG. 13 based on the initial reliability adjustment information of FIG. 16.

In some example embodiments as illustrated in FIG. 17A, the first through third LLRS LLR_A11~LLR_A13 may be generated such that the reliability of the read bit is decreased as the voltage difference between the average threshold voltage and the reference voltage is decreased. In FIG. 17A, L, D1 and D2 have the positive values, and the absolute value of the LLR corresponding to the first information value NR may be decreased. As described above, the decrease in the LLR indicates the decrease in the reliability.

In some example embodiments as illustrated in FIG. 17B, the first through third LLRS LLR_A11~LLR_A13 may be generated such that the reliability of the read bit is increased as the voltage difference between the average threshold voltage and the reference voltage is increased. In FIG. 17B, L, U1 and U2 have the positive values, and the absolute value of the LLR corresponding to the second information value FR may be increased. As described above, the increase in the LLR indicates the increase in the reliability.

In some example embodiments as illustrated in FIG. 17C, the first through third LLRS LLR_A11~LLR_A13 may be generated such that the reliability of the read bit is decreased as the voltage difference between the average threshold voltage and the reference voltage is decreased and also the reliability of the read bit is increased as the voltage difference between the average threshold voltage and the reference voltage is increased. In FIG. 17C, L, L1, L2, U1 and U2 have the positive values, the absolute value of the LLR corresponding to the first information value NR may be decreased and the absolute value of the LLR corresponding to the second information value FR may be increased.

Figure 18:
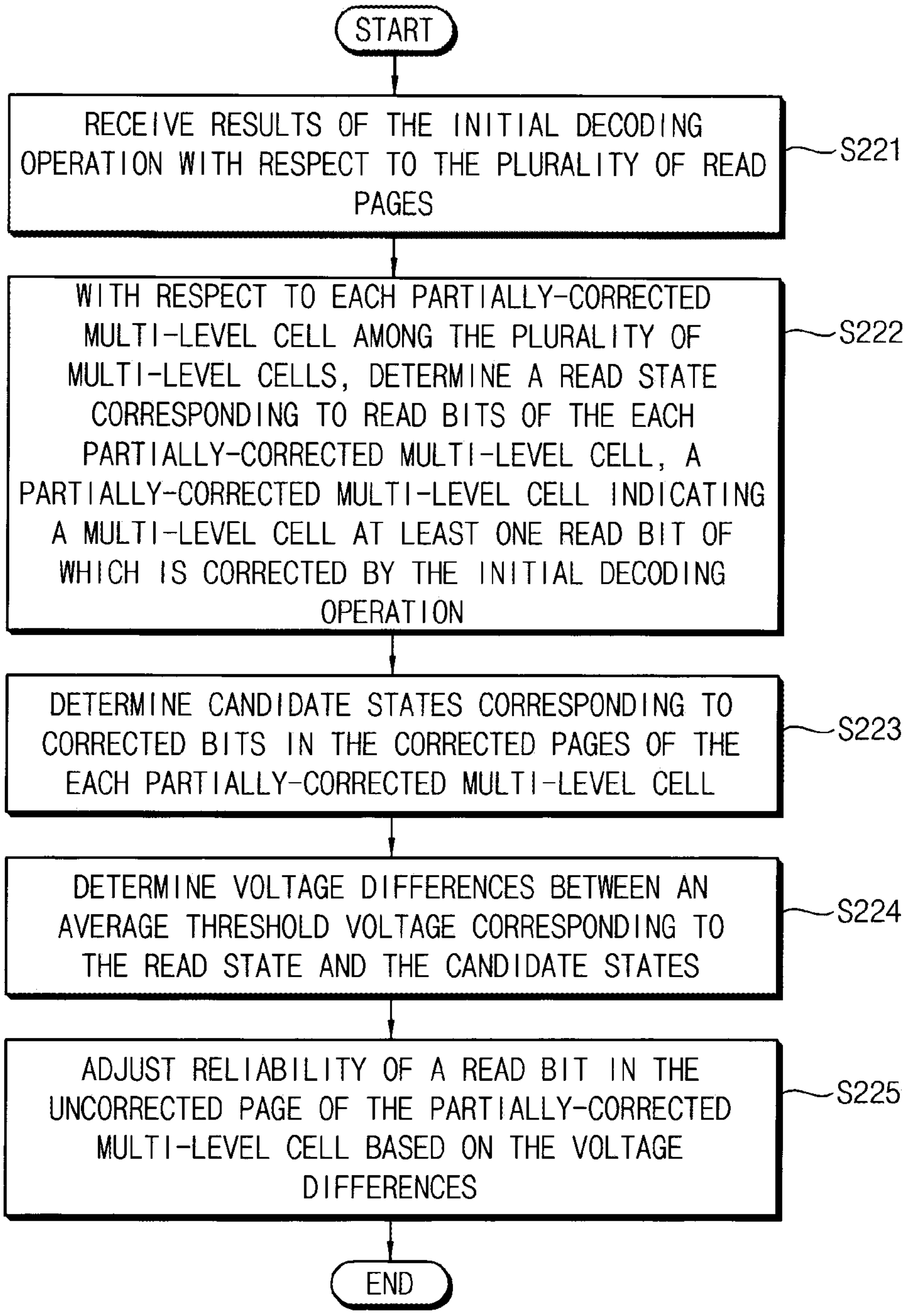
FIG. 18 is a flow chart illustrating an example embodiment of adjusting reliability in a re-decoding operation for an error correction method according to example embodiments.

FIG. 18 is a flow chart illustrating an example embodiment of adjusting reliability in a re-decoding operation for an error correction method according to example embodiments.

Referring to FIGS. 1, 12 and 18, the state equalizer EQL may receive results RLT1~RLT3 of the initial decoding operation with respect to the plurality of read pages PG1, PG2 and PG2 from the decoding circuit 2800 (S221). The results RLT1~RLT3 of the initial decoding operation may include success or failure of each read page, corrected data in case of decoding success, bit error distribution in case of decoding failure, etc.

The state equalizer EQL, with respect to each partially-corrected multi-level cell among the plurality of multi-level cells MC1~MC6, determine a read state corresponding to read bits of the each partially-corrected multi-level cell, a partially-corrected multi-level cell indicating a multi-level cell having at least one read bit of which is corrected by the initial decoding operation (S222).

The state equalizer EQL may determine candidate states corresponding to corrected bits in the corrected pages of the each partially-corrected multi-level cell (S223), and determine voltage differences between an average threshold voltage corresponding to the read state and the candidate states (S224).

The state equalizer EQL may adjust reliability of a read bit in the uncorrected page of the partially-corrected multi-level cell based on the voltage differences (S225).

Figure 19:
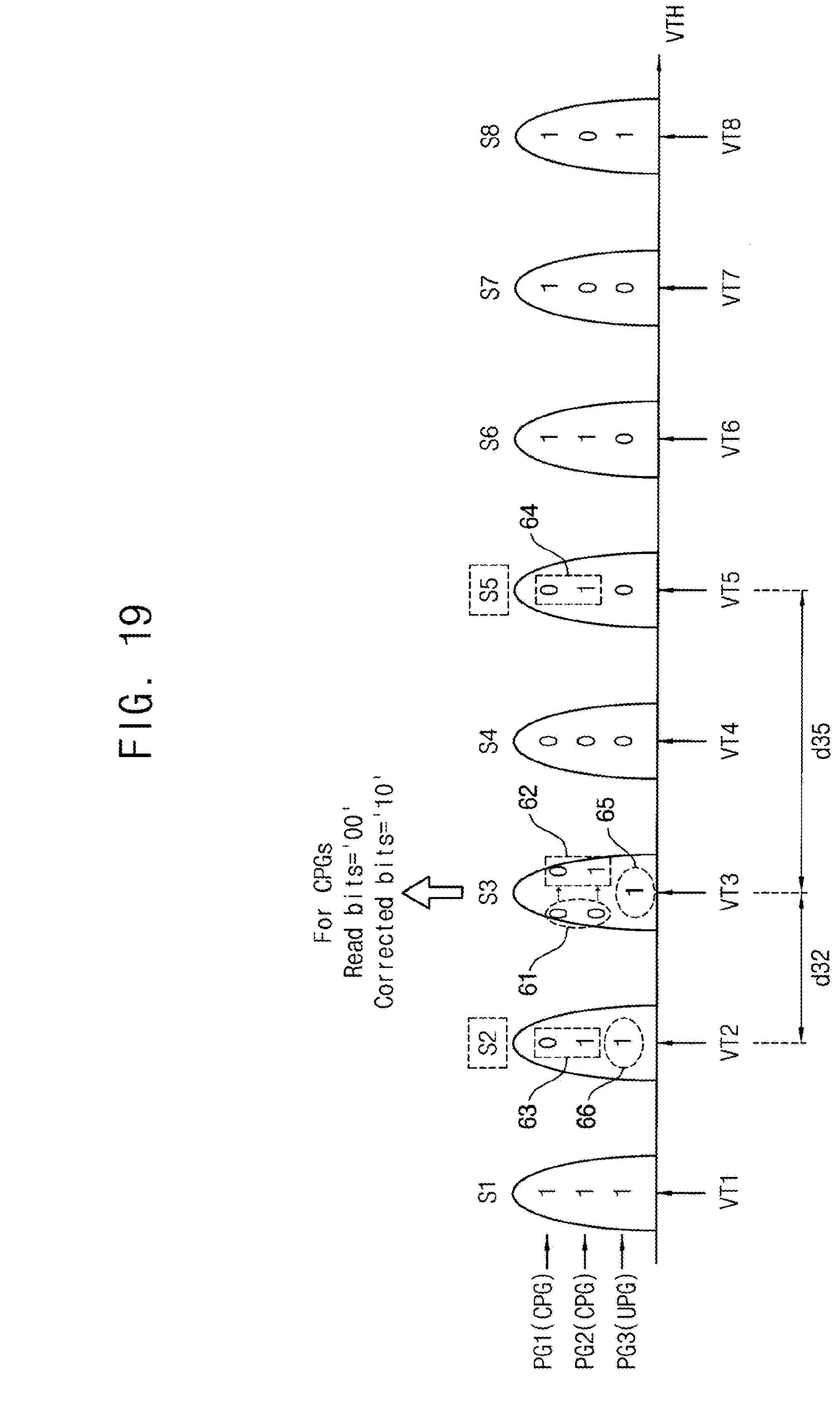
FIG. 19 is a diagram for describing an example embodiment of a reliability adjustment in a re-decoding operation.

FIG. 19 is a diagram for describing an example embodiment of a reliability adjustment in a re-decoding operation, and FIG. 20 is a diagram illustrating an example embodiment of a corrected reliability adjustment information according to the reliability adjustment of FIG. 19.

FIG. 19 illustrates an example that the first and second read pages PG1 and PG2 correspond to the corrected pages CPG, and the third read page PG3 corresponds to the uncorrected page UPG. For example, the read bits 61 of the fifth memory cell MC5, the read state RDST of which corresponds to the third state S3 may corrected to the corrected bits 62, and the read bits of the other read pages PG1, PG2, PG4, PG5 and PG6 may be maintained without correction. In other words, the fifth memory cell MC5 may correspond to a partially-corrected multi-level cell. In FIG. 19, VT1~VT8 indicate the average threshold voltages respectively corresponding to the first through eighth states S1~S8.

Referring to FIGS. 18 and 19, the second and fifth states S2 and S5 corresponding to the same read bits as the corrected bits 62 of the partially-corrected memory cell MC5 are determined as the candidate states. Voltage differences d32 and d35 between the average threshold voltages VT2 and VT5 corresponding to the candidate state S2 and S5 and the average threshold voltage VT3 corresponding to the read state, that is, the third state S3 of the partially-corrected memory cell MC5 may be determined.

The state equalizer EQL may determine the reference state to the second state S2 corresponding to the minimum voltage difference d32 among the voltage differences d32 and d35 of the candidate states S2 and S5. The state equalizer EQL may compare the read bits 65 in the uncorrected page PG3 of the partially-corrected memory cell MC5 and the reference read bit 66 in the uncorrected page PG3 of the reference state S3 to adjust the reliability of the read bit 65 in the uncorrected page PG3 of the partially-corrected memory cell MC5.

For example, as illustrated in FIG. 19, when (and/or in response to) the bit value '1' in the uncorrected page PG3 of the read bit 65 is equal to the bit value '1' of the reference bit 66, the reliability of the read bit 65 in the uncorrected page PG3 may be increased.

FIG. 20 illustrates corrected reliability adjustment information CRAINF3 indicating increase or decrease of the reliability of the read bits in the uncorrected page PG3. The state equalizer EQL may assign a third information value UP indicating the increase of the reliability to the read bit 65 in the uncorrected page PG3 of the partially-corrected multi-level cell MC5. The state equalizer EQL may assign a fourth information value MN to the read bits of the multi-level cells MC1~MC4 and MC6 errors of which are not corrected by the initial decoding operation maintain. The reliability of the read bits of the fourth information value MN may not be adjusted.

Figure 21:
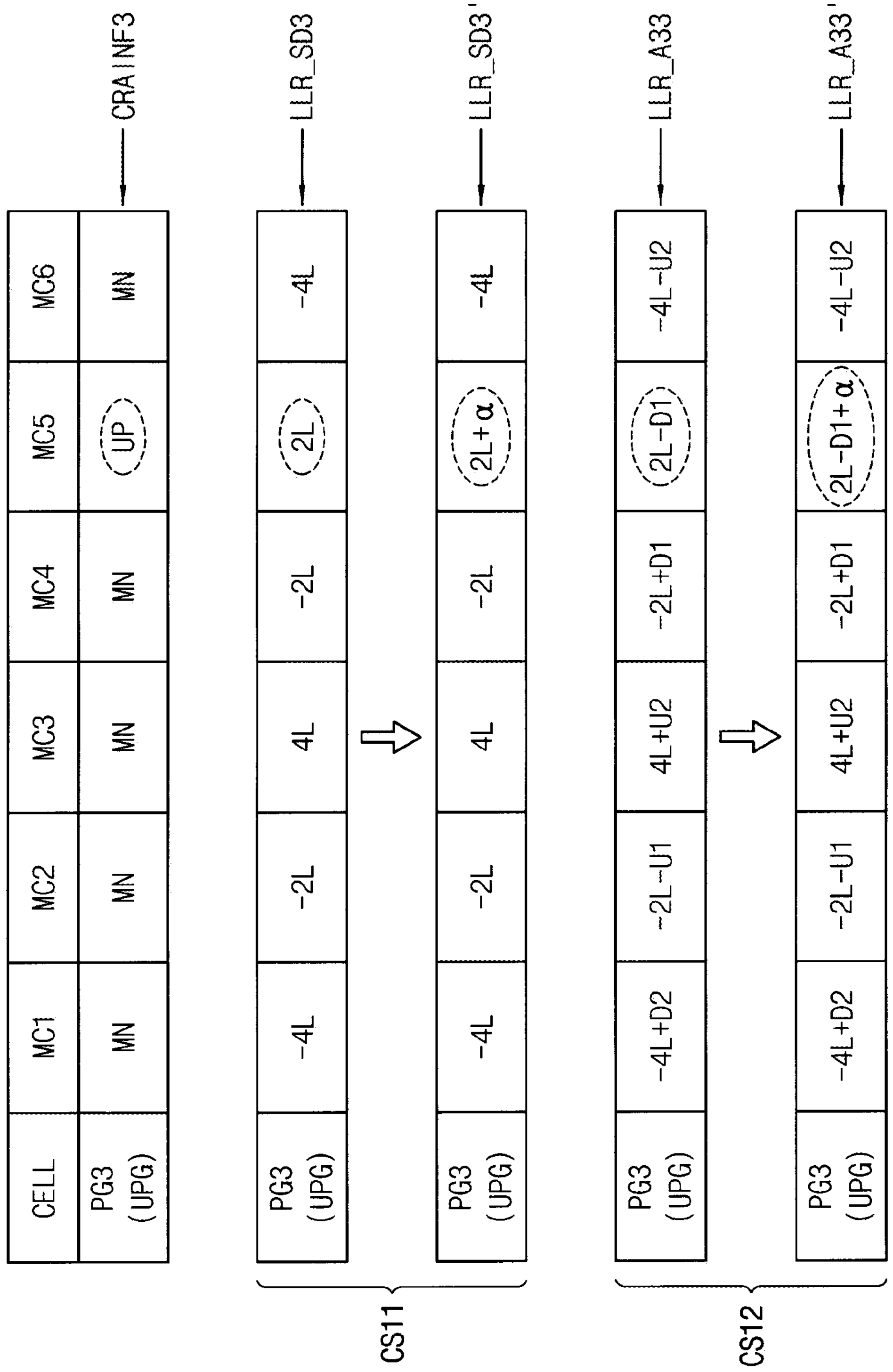
FIG. 21 is a diagram illustrating an example embodiment of an LLR adjustment according to the initial reliability adjustment information of FIG. 20.

FIG. 21 is a diagram illustrating an example embodiment of an LLR adjustment according to the initial reliability adjustment information of FIG. 20.

The LLR generator LGEN may generate a plurality of LLRs respectively corresponding to a plurality of read pages based on the corrected reliability adjustment information as described with reference to FIG. 20.

In some example embodiments, as a first case CS11, the LLR generator LGEN may generate the LLRs LLR_SD3 determined based on the soft decision data in the initial decoding operation and generate the adjusted LLRs LLR_SD3' determined based on the corrected reliability adjustment information CRAINF3 of FIG. 20 in the re-decoding operation In some example embodiments, as a second case CS11, the LLR generator LGEN may generate the LLRs LLR_SD33 determined based on the initial reliability adjustment information of FIG. 16 in the initial decoding operation and generate the adjusted LLRs LLR_SD33' determined based on the corrected reliability adjustment information CRAINF3 of FIG. 20 in the re-decoding operation.

In FIG. 21, L, D1, D2, U1, U2 and a have the positive values. As a result, the reliability of the read bit in the uncorrected page PG3 of the fifth multi-level cell MC5 may be increased and the absolute value of the LLR may be increased by a.

Figure 22:
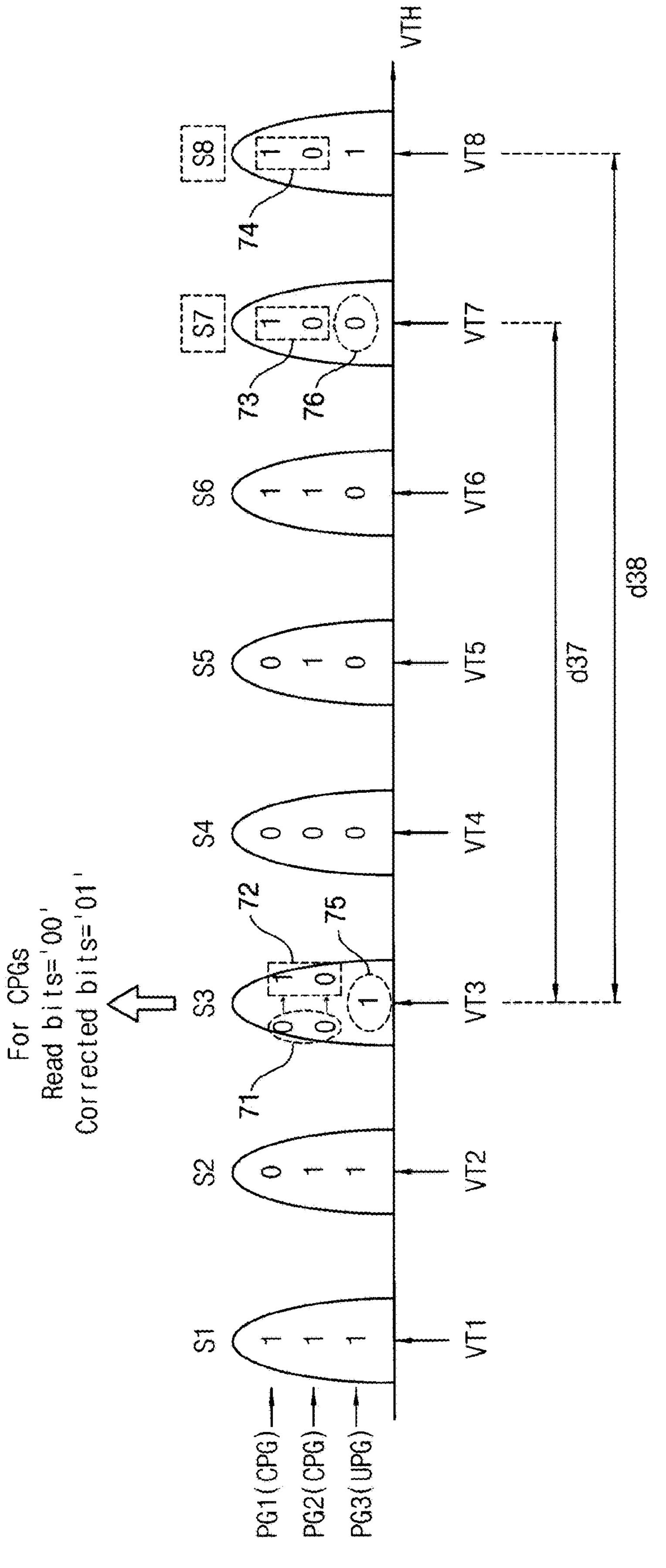
FIG. 22 is a diagram for describing an example embodiment of a reliability adjustment in a re-decoding operation.

FIG. 22 is a diagram for describing an example embodiment of a reliability adjustment in a re-decoding operation, and FIG. 23 is a diagram illustrating an example embodiment of corrected reliability adjustment information according to the reliability adjustment of FIG. 22.

FIG. 22 illustrates an example that the first and second read pages PG1 and PG2 correspond to the corrected pages CPG, and the third read page PG3 corresponds to the uncorrected page UPG. For example, the read bits 71 of the fifth memory cell MC5, the read state RDST of which corresponds to the third state S3, may be corrected to the corrected bits 72, and the read bits of the other read pages PG1, PG2, PG4, PG5 and PG6 may be maintained without correction. In other words, the fifth memory cell MC5 may correspond to a partially-corrected multi-level cell. In FIG. 22, VT1~VT8 indicate the average threshold voltages respectively corresponding to the first through eighth states S1~S8.

Referring to FIGS. 18 and 20, the seventh and eighth states S7 and S8 corresponding to the same read bits as the corrected bits 72 of the partially-corrected memory cell MC5 are determined as the candidate states. Voltage differences d37 and d38 between the average threshold voltages VT7 and VT8 corresponding to the candidate state S7 and S8 and the average threshold voltage VT3 corresponding to the read state, that is, the third state S3 of the partially-corrected memory cell MC5 may be determined.

The state equalizer EQL may adjust the reliability of the read bits based on such voltage differences. The state equalizer EQL may determine the reference state to the seventh state S7 corresponding to the minimum voltage difference d37 among the voltage differences d37 and d38 of the candidate states S7 and S8. The state equalizer EQL may compare the read bits 75 in the uncorrected page PG3 of the partially-corrected memory cell MC5 and the reference read bit 76 in the uncorrected page PG3 of the reference state S7 to adjust the reliability of the read bit 75 in the uncorrected page PG3 of the partially-corrected memory cell MC5.

For example, as illustrated in FIG. 22, when (and/or in response to) the bit value '1' in the uncorrected page PG3 of the read bit 75 is different from to the bit value '0' of the reference bit 76, the reliability of the read bit 75 in the uncorrected page PG3 may be decreased.

FIG. 23 illustrates corrected reliability adjustment information CRAINF3 indicating increase or decrease of the reliability of the read bits in the uncorrected page PG3. The state equalizer EQL may assign a fifth information value ND indicating the decrease of the reliability to the read bit 75 in the uncorrected page PG3 of the partially-corrected multi-level cell MC5. The state equalizer EQL may assign the fourth information value MN to the read bits of the multi-level cells MC1~MC4 and MC6 errors of which are not corrected by the initial decoding operation to maintain the reliability without adjustment.

Figure 24:
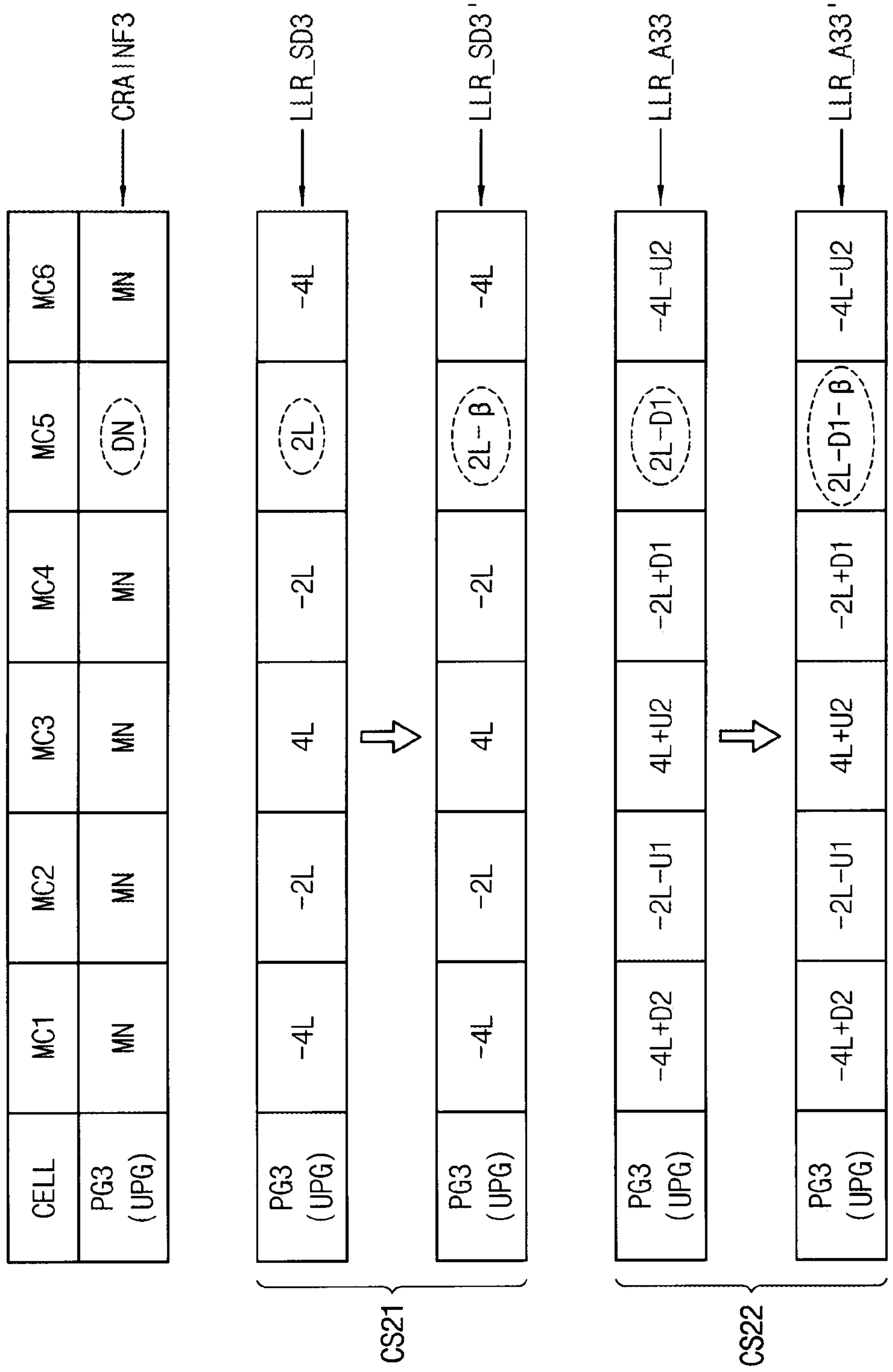
FIG. 24 is a diagram illustrating an example embodiment of an LLR adjustment according to the corrected reliability adjustment information of FIG. 23.

FIG. 24 is a diagram illustrating an example embodiment of an LLR adjustment according to the corrected reliability adjustment information of FIG. 23.

The LLR generator LGEN may generate a plurality of LLRs corresponding to the corrected page PG2 for the re-decoding operation based on the corrected reliability adjustment information as described with reference to FIG. 23.

In some example embodiments, as a third case CS21, the LLR generator LGEN may generate the LLRs LLR_SD3 determined based on the soft decision data in the initial decoding operation and generate the adjusted LLRs LLR_SD3' determined based on the corrected reliability adjustment information CRAINF3 of FIG. 23 in the re-decoding operation.

In some example embodiments, as a fourth case CS22, the LLR generator LGEN may generate the LLRs LLR_SD33 determined based on the initial reliability adjustment information of FIG. 16 in the initial decoding operation and generate the adjusted LLRs LLR_SD33' determined based on the corrected reliability adjustment information CRAINF3 of FIG. 23 in the re-decoding operation In FIGS. 24, L, D1, D2, U1, U2 and 13 have the positive values. As a result, the reliability of the read bit in the uncorrected page PG3 of the fifth multi-level cell MC5 may be decreased and the absolute value of the LLR may be decreased by 13. When (and/or in response to) 2L is smaller than D1+13, the sign value of the LLR may be inverted by the reliability adjustment. As such, the bit value of the read bit may be changed from 1 to 0 or from 0 to 1 by the reliability adjustment.

Hereinafter, example embodiments corresponding to the 3-bit soft decision read operation are described with reference to FIGS. 25 through 30*b*. The descriptions repeated with the 2-bit soft decision read operation of FIGS. 10 through 24 may be omitted.

Figures 25, 26:
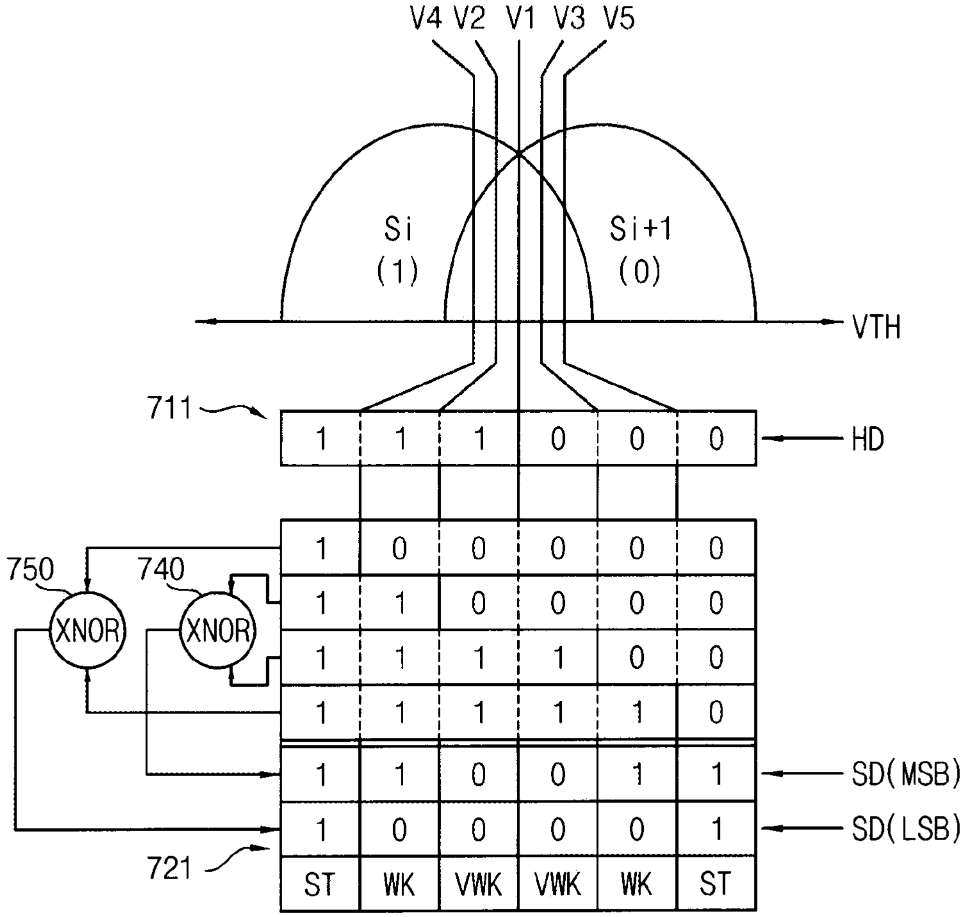
FIG. 25 is a diagram illustrating an example of a 3-bit soft decision read operation of a nonvolatile memory device included in a memory system according to example embodiments.
FIG. 26 is a diagram illustrating an example of an LLR corresponding to the 3-bit soft decision read operation of FIG. 25.

FIG. 25 is a diagram illustrating an example of a 3-bit soft decision read operation of a nonvolatile memory device included in a memory system according to example embodiments.

As illustrated in FIG. 25, the nonvolatile memory device may perform a 3-bit soft decision read operation. The 3-bit soft decision read operation may include five read operations using seven voltages V1, V2, V3, V4 and V5 having regular intervals. For example, the five through fifth voltages V1, V2, V3, V4 and V5 may include the three voltages V1, V2 and V3 used in the 2-bit soft decision read operation, and may further include a fourth voltage V4 lower than the second voltage V2 and a fifth voltage V5 higher than the third voltage V3. In some embodiments, the data 711 read by using the first voltage V1 may be the hard decision data (HD) read by the hard decision read operation. The data read by using the second through fifth voltages V2~V5 may be used to obtain the soft decision data (SD) 721. The soft decision data 721 may include most significant bit (MSB) soft decision data and the least significant bit (LSB) soft decision data, which may be obtained by performing desired and/or alternatively predetermined logical operations (e.g., XNOR operations 740 and 750) (or encoding) on data read by using the second through fifth voltages V2~V4. Each bit pair of the soft decision data 721 having two bits may represent a degree of reliability of a corresponding bit of the hard decision data 711. For example, each soft decision bit pair having a value of '11' may represent that a corresponding bit of the hard decision data has strong (VS) reliability, each soft decision bit pair having a value of '10' may represent that a corresponding bit of the hard decision data has intermediate (WK) reliability, and each soft decision bit pair having a value of '00' may represent that a corresponding bit of the hard decision data has weak (VWK) reliability.

FIG. 26 is a diagram illustrating an example of an LLR corresponding to the 3-bit soft decision read operation of FIG. 25.

Referring to FIG. 26, the first bit of the read data RDATA may correspond to the hard decision data and the second and third bits of the read data RDATA may correspond to the soft decision data. The hard decision data may be the read bit and the soft decision data may indicate the reliability of the hard decision data. As described with reference to FIG. 25, a bit pair of the soft decision data having a value of '11' may represent that a corresponding bit of the hard decision data has strong (ST) reliability, a bit pair of the soft decision data having a value of '10' may represent that a corresponding bit of the hard decision data has intermediate (WK) reliability, and a bit pair of the soft decision data having a value of '00' may represent that a corresponding bit of the hard decision data has weak (VWK) reliability FIG. 26 illustrates an example of mapping between the read data RDATA and the LLR. In FIG. 26, L indicates a positive value which may be set to a proper value according to a decoding scheme. The LLR of +5L indicates the bit value of 1 with ST reliability, the LLR of +3L indicates the bit value of 1 with WK reliability, the LLR of +L indicates the bit value of 1 with VWK reliability, LLR of −5L indicates the bit value of 0 with ST reliability, the LLR of −3L indicates the bit value of 0 with WK reliability, and the LLR of −L indicates the bit value of 0 with VWK reliability.

FIG. 27 is a diagram illustrating a plurality of read pages used in an error correction method according to example embodiments, and FIG. 28 is a diagram illustrating LLRs corresponding to the plurality of read pages of FIG. 27.

FIG. 27 illustrates first through third read pages PG1, PG2 and PG3 read from first through sixth memory cells MC1~MC6 of FIG. 12, an example. The first through third read pages PG1, PG2 and PG3 may include first through third read bits RB1~RB3 corresponding to the hard decision data and the reliability ST, WK or VWK of the corresponding bit.

Referring to FIGS. 1 and 28, the LLR generator LGEN may generate the first LLR LLR_SD1 corresponding to the first read page PG1, the second LLR LLR_SD2 corresponding to the second read page PG2 and the third LLR LLR_SD3 corresponding the third page PG3 based on the soft decision data indicating the reliability ST, WK or VWK, respectively.

FIG. 29 is a diagram illustrating LLRs adjusted by a reliability adjustment for an error correction method according to example embodiments.

Using the method as described with reference to FIG. 15, the state equalizer EQL may assign the first information value NR or the second information value FR to all of the read bits in the same way as described with reference to FIG. 15, to generate the initial reliability adjustment information as illustrated in FIG. 29. The initial reliability adjustment information may include first through initial reliability adjustment information IRAINF1~IRAINF3 respectively corresponding to the first through read pages PG1, PG2 and PG3.

For example, for example, using the method as described with reference to FIG. 17C, the LLR generator LGEN may adjust, the first through third LLRs LLR_A31~LLR_A33 as illustrated in FIG. 29 by adjusting the first through third LLRs LLR_SD1~LLR_SD3 as illustrated in FIG. 29.

Figure 30A:
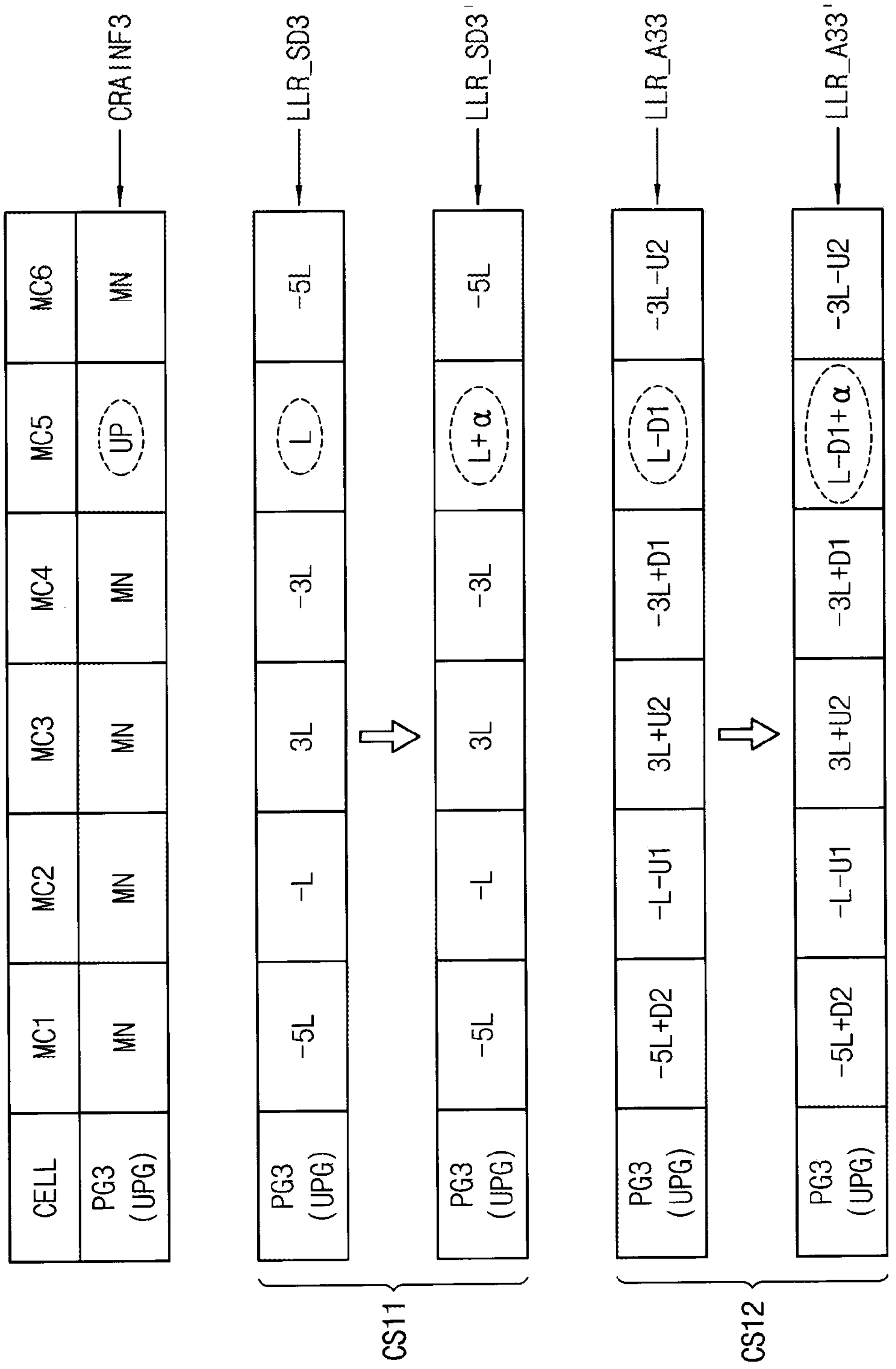
FIGS. 30A and 30B are diagrams illustrating example embodiments of an LLR adjustment for an error correction method according to example embodiments.
Figure 30B:
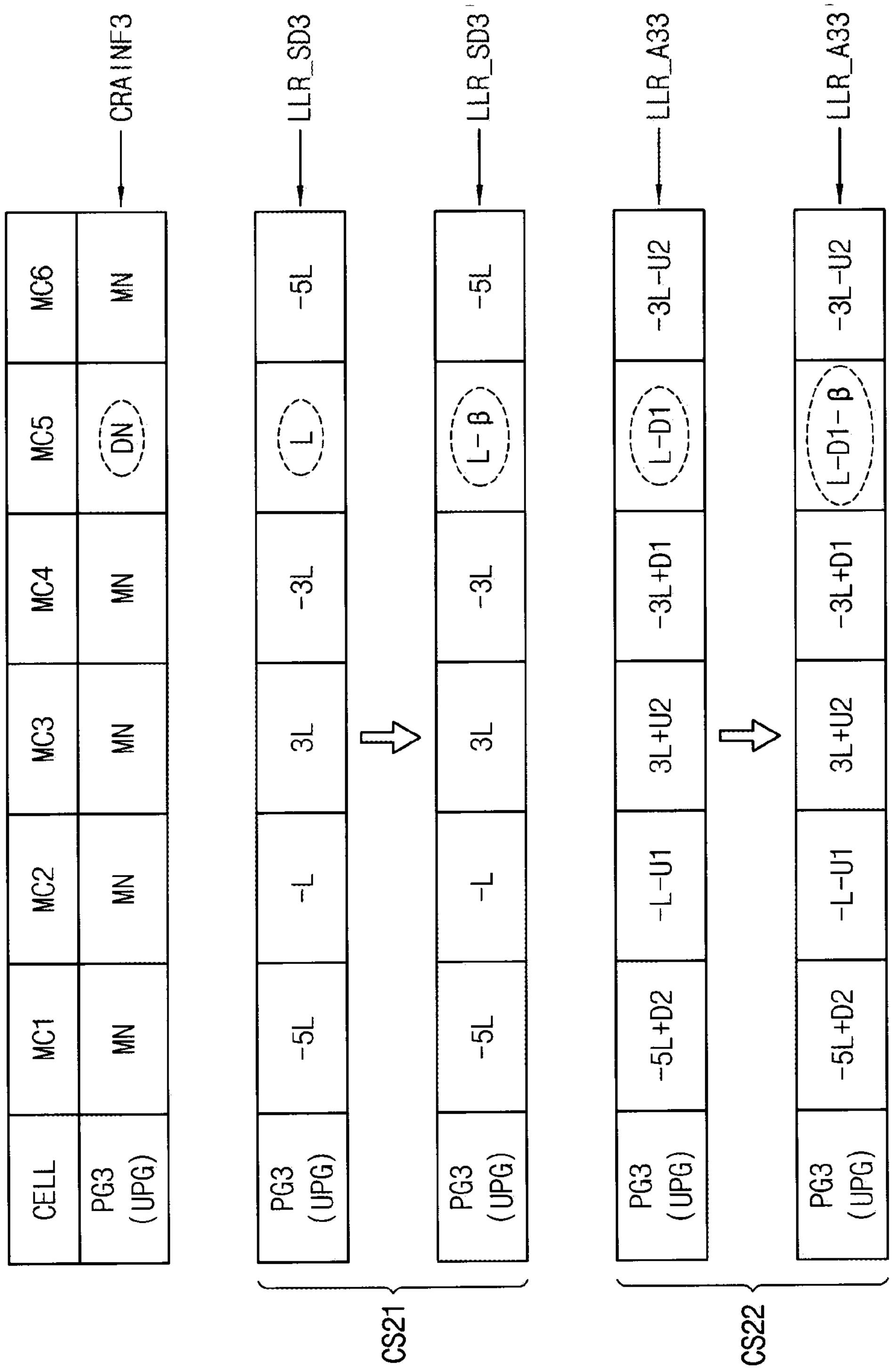

FIGS. 30A and 30B are diagrams illustrating example embodiments of an LLR adjustment for an error correction method according to example embodiments.

The LLR generator LGEN may generate the LLRs corresponding to the corrected page PG3 for the re-decoding operation based on the corrected reliability adjustment information as described with reference to FIGS. 20 and 23. The LLR adjustment of FIG. 30*a* is substantially the same as the LLR adjustment of FIG. 21, the LLR adjustment of FIG. 30*b* is substantially the same as the LLR adjustment of FIG. 24, and the repeated descriptions are omitted.

Figures 31A, 31B:
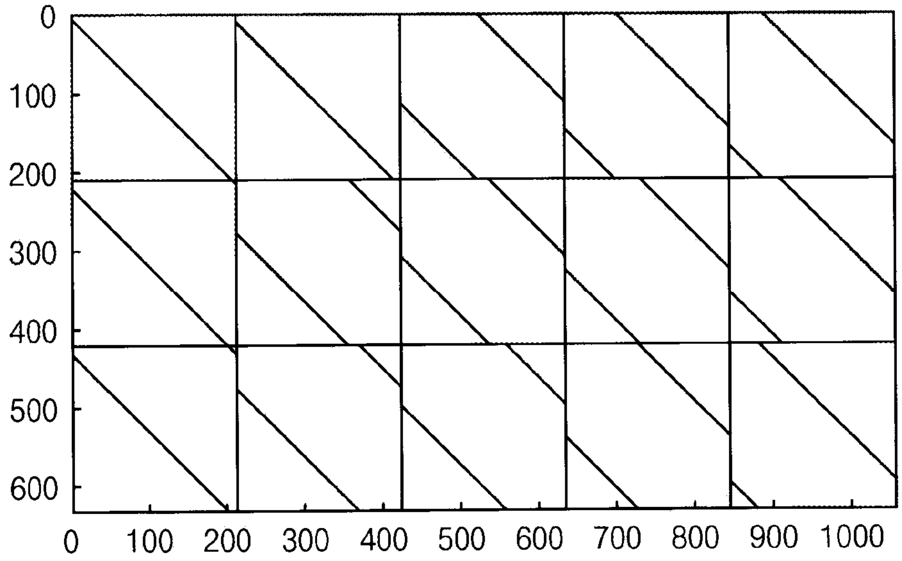
FIGS. 31A and 31B are diagram for describing a quasi-cyclic LDPC (QC-LDPC) code for an error correction method according to example embodiments.

FIGS. 31A and 31B are diagram for describing a quasi-cyclic LDPC (QC-LDPC) code for an error correction method according to example embodiments.

An LDPC code having a codeword length of n and an information length of k may be represented by the PCM having a size of (n−k)*n. The LDPC code has a higher correction capability as the codeword length is long. For example, the memory controller may use a codeword longer than 1 KB. The size of the PCM of the long codeword is very large and it is difficult to store the PCM of the big size.

To solve such problems, the PCM may be divided into a plurality of sub blocks and the PCM may be defined by information of each sub matrix, for example, a position of each sub matrix, a shape of each sub matrix, etc. The LDPC code defined as such may be referred to as a quasi-cyclic LDPC (QC-LDPC) code. For example, it is assumed that the codeword length is 1055 bits and the information length is 422 (=1055-633). If the size of the sub matrix is 211, the five sub matrices may be arranged in each row (1055/211=5) and the three sub matrices may be arranged in each column (633/211=3) as illustrated in FIG. 31A. Each sub matrix may be obtained by a circular shifting of an identity matrix. The PCM may be simplified to a 3*5 matrix as illustrated in FIG. 31B using shifter numbers of the sub matrices. In other words, the PCM may be represented simply in comparison with the representation of 633*1055 matrix. The QC-LDPC code may be efficiently applied to various systems.

For example, in case of the QC-LDPC, the state equalizer EQL in the data converter 2300 in FIG. 1 may generate LLRs corresponding to the uncorrected page by adjusting reliability of a target region corresponding to a portion of a plurality of sub matrices of a parity check matrix of the LDPC code.

The state equalizer EQL may perform the re-decoding operation by adjusting the reliability only for the target region based on error distribution that may be provided as the decoding results of the uncorrected page. For example, the state equalizer EQL may set the sub matrix having the highest error rate to adjust the reliability and generate the LLRs corresponding to the uncorrected page. The decoding circuit 2800 may perform a first re-decoding operation based on the received LLRs. If the error correction is not successful by the first re-decoding operation, the state equalizer EQL may increase the target region to include more sub matrix and provide the LLRs for a second re-decoding operation.

Figure 32:
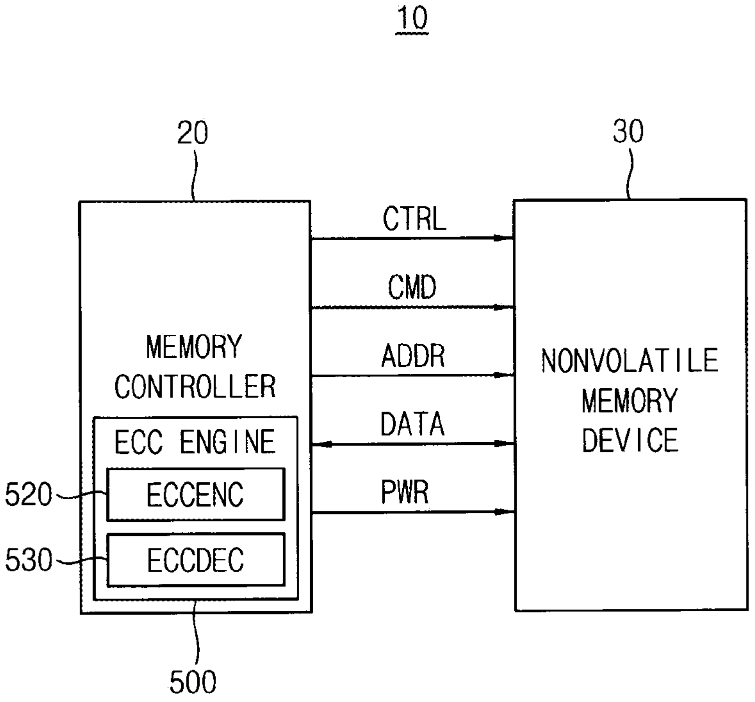
FIG. 32 is a diagram illustrating a memory system according to example embodiments.

FIG. 32 is a diagram illustrating a memory system according to example embodiments.

Referring to FIG. 32, a memory system 10 may include a memory controller 20 and at least one memory device 30.

The memory device 30 may be a nonvolatile memory device as described herein, and the memory system 10 may include data storage media based on flash memory such as a memory card, a universal serial bus (USB) memory and solid state drive (SSD).

The nonvolatile memory device 30 may perform a read operation, an erase operation, and a program operation or a write operation under control of the memory controller 20. The nonvolatile memory device 30 receives a command CMD, an address ADDR and data through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

The memory controller 20 may include an ECC engine 500. The ECC engine may include an ECC encoder ECCENC 520 and an ECC decoder ECCDEC 530. The ECC decoder 530 may include a data converter to perform the error correction method as described with reference to FIGS. 1 through 31B.

Figure 33:
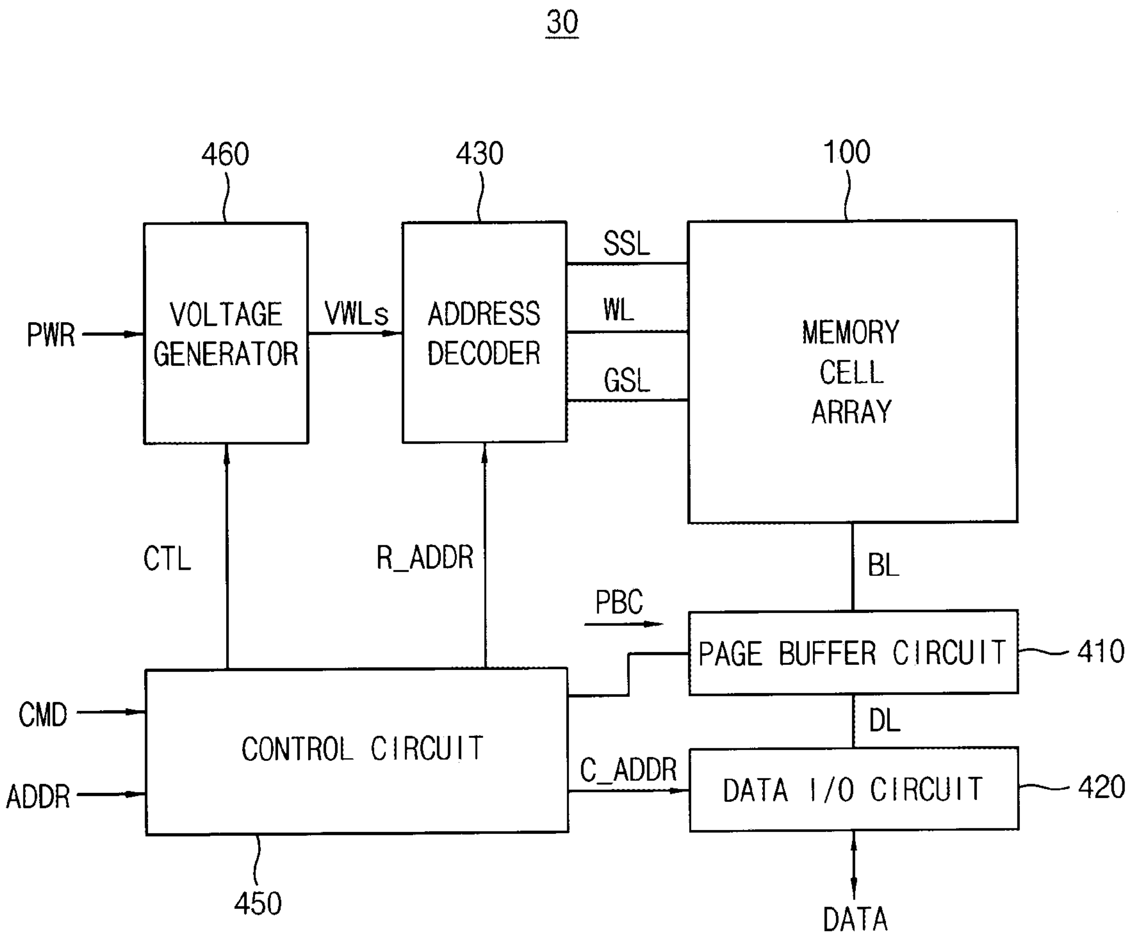
FIG. 33 is a block diagram illustrating a nonvolatile memory device according to example embodiments.

FIG. 33 is a block diagram illustrating a nonvolatile memory device according to example embodiments.

Referring to FIG. 33, the nonvolatile memory device 30 includes a memory cell array 100, a page buffer circuit 410, a data input/output circuit 420, an address decoder 430, a control circuit 450 and a voltage generator 460.

The memory cell array 100 (e.g., a plurality of memory cells) may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In some example embodiments, the memory cell array 100 may include a plurality of NAND strings that are vertically oriented such that at least one memory cell is located over another memory cell.

The control circuit 450 may receive a command (signal) CMD and an address (signal) ADDR from the memory controller 20 and control erasure, programming and read operations of the nonvolatile memory device 30 based on the command signal CMD and the address signal ADDR. An erasure operation may comprise performing a sequence of erase loops, and a program operation may include performing a sequence of program loops. Each program loop may include a program period and a program verification period. Each erase loop may include an erase period and an erase verification period. The read operation may include a normal read operation and data recover read operation.

For example, the control circuit 450 may generate the control signals CTL, which are used for controlling the voltage generator 460, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine rest of the plurality of word lines WL except for the selected word line as unselected word lines based on the row address R_ADDR.

In addition, during the program operation or the read operation, the address decoder 430 may determine one of the plurality of string selection lines SSL as a selected string selection line and determine rest of the plurality of string selection lines SSL except for the selected string selection line as unselected string selection lines based on the row address R_ADDR.

The voltage generator 460 may generate word line voltages VWL, which are required for the operation of the memory cell array 100 of the nonvolatile memory device 30, based on the control signals CTL. The voltage generator 460 may receive the power PWR from the memory controller 20. The word line voltages VWL may be applied to the plurality of word lines WL through the address decoder 430.

The page buffer circuit 410 may be coupled to the memory cell array 100 through the plurality of bit lines BL. The page buffer circuit 410 may include a plurality of buffers. In some example embodiments, each buffer may be connected to only one bit line. In some example embodiments, each buffer may be connected to two or more bit lines. The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 420 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

Figure 34:
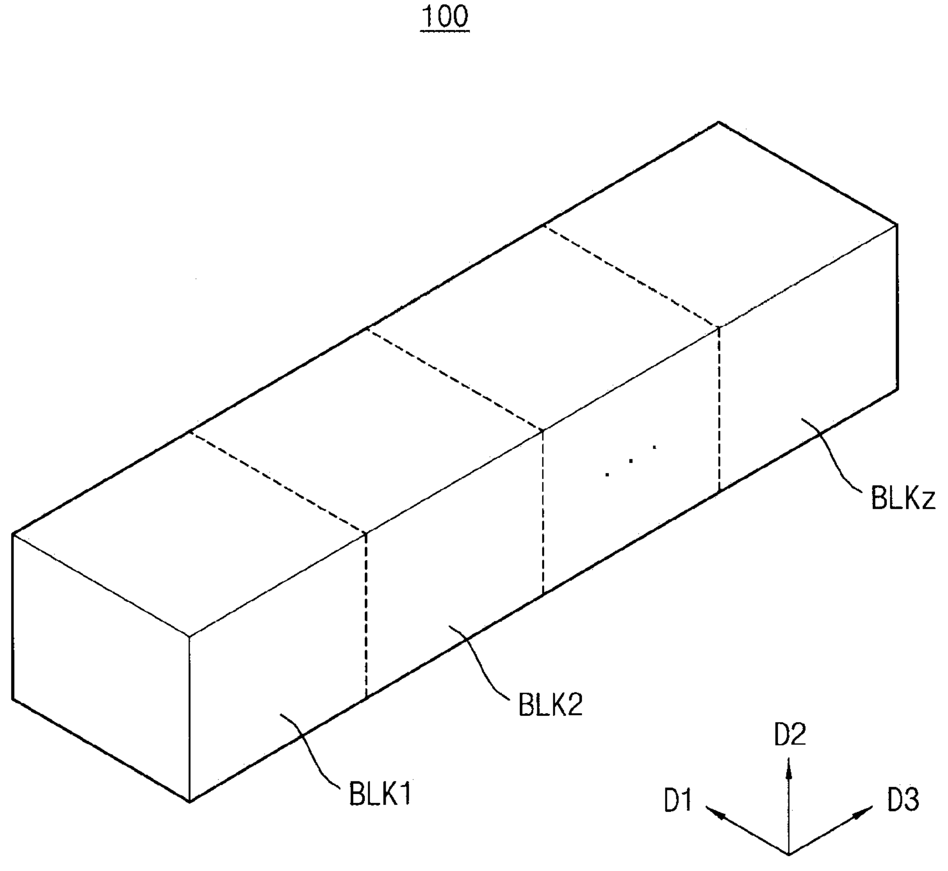
FIG. 34 is a block diagram illustrating a memory cell array included in the nonvolatile memory device of FIG. 33.
Figure 35:
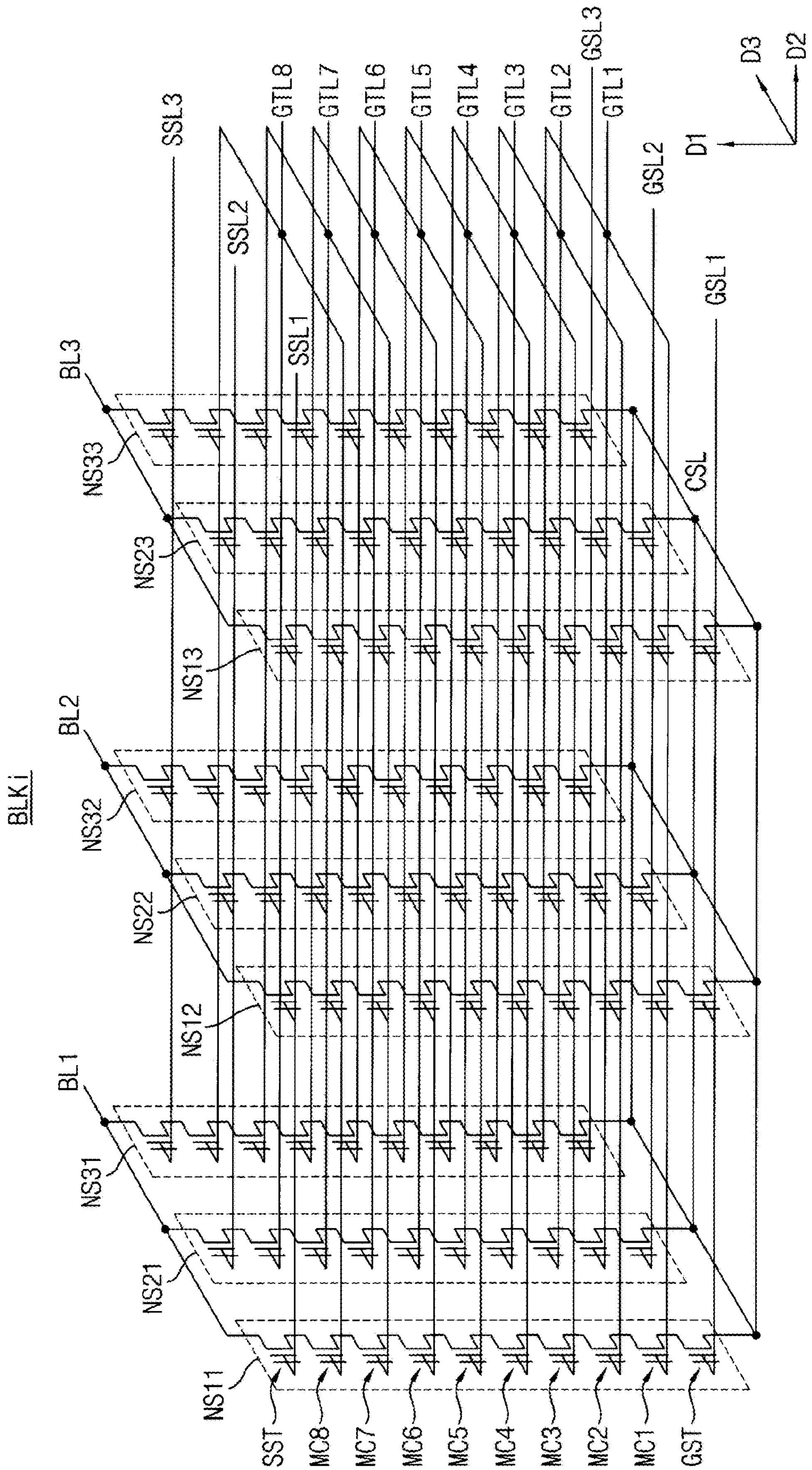
FIG. 35 is a circuit diagram illustrating an equivalent circuit of a memory block described with reference to FIG. 34.

FIG. 34 is a block diagram illustrating a memory cell array included in the nonvolatile memory device of FIG. 33, and FIG. 35 is a circuit diagram illustrating an equivalent circuit of a memory block described with reference to FIG. 34.

Referring to FIG. 34, the memory cell array 100 may include a plurality of memory blocks BLK1 to BLKz. In some example embodiments, the memory blocks BLK1 to BLKz are selected by the address decoder 430 in FIG. 33. For example, the address decoder 430 may select a particular memory block BLK corresponding to a block address among the memory blocks BLK1 to BLKz.

The memory block BLKi of FIG. 35 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 35, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 35, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. Even though not illustrated, the gate lines corresponding to the intermediate switching lines may be separated as will be described below. In FIG. 35, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

Figure 36:
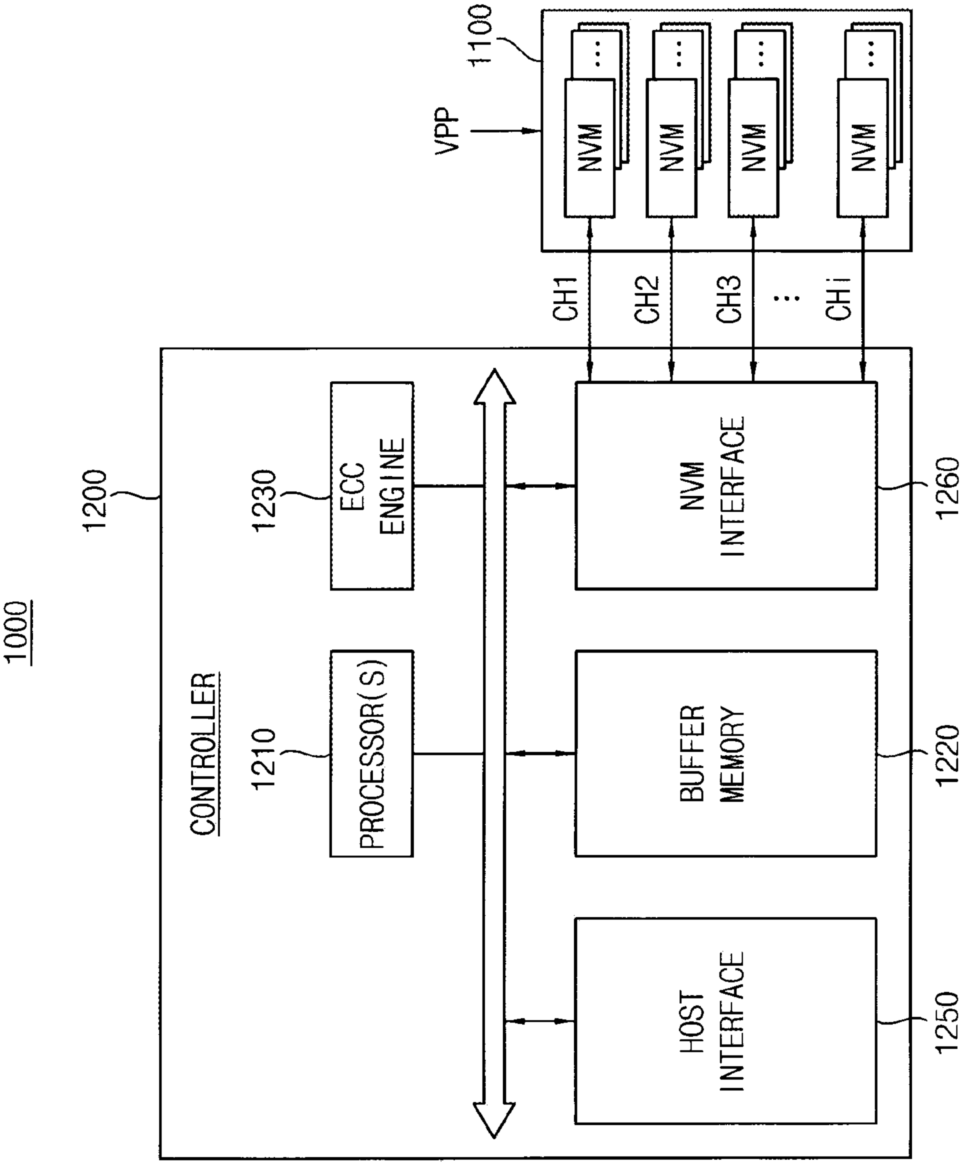
FIG. 36 is a block diagram illustrating a solid state disk or solid state drive (SSD) according to example embodiments.

FIG. 36 is a block diagram illustrating a solid state disk or solid state drive (SSD) according to example embodiments.

Referring to FIG. 36, an SSD 1000 includes multiple nonvolatile memory devices 1100 and an SSD controller 1200.

The nonvolatile memory devices 1100 may be configured optionally to receive a high voltage VPP. The nonvolatile memory devices 1100 may be the above-described memory devices disclosed above.

The SSD controller 1200 is connected to the nonvolatile memory devices 1100 through multiple channels CH1 to CHi. The SSD controller 1200 includes one or more processors 1210, a buffer memory 1220, an ECC engine 1230, a host interface 1250, and a nonvolatile memory interface 1260. The buffer memory 1220 stores data used to drive the SSD controller 1200. In addition, the buffer memory 1220 may temporarily store data for read and write operations. As described above, the ECC engine 1230 may include a data converter configured to perform the error correction method according to example embodiments.

Inventive concepts may be applied to many electronic devices and systems. For example, inventive concepts may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

In example embodiments, features of the decoders 200 and 2001 (e.g., the buffer 2100; state equalizer EQL and LLR generator LGEN of the data converter 2300; switch networks SWN1 and SWN2, VNP 2810, CNP 2830, controller 2850, update manager UDMNG, corrected data manager CDMNG 2853, and syndrome checker SC 2854 of the decoding circuit 2801) in FIGS. 1 and 8, memory controller 20 (e.g., ECC Engine 500 including an ECC encoder ECCENC 520 and an ECC decoder ECCDEC 530) in FIG. 32, voltage generator 460, address decoder 430 in FIG. 33, and controller 1200 (e.g., processor 1210, ECC Engine 1230, Host Interface 1250, buffer memory 1220, and nonvolatile memory interface 1260) in FIG. 36 may include processing circuitry such as hardware including logic circuits; a hardware/software combination such as a processor executing software; memory; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory may include a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM), but example embodiments are not limited thereto.

The foregoing description is illustrative of example embodiments and is not to be construed as limiting thereof. Although a few example embodiments have been described, those skilled in the art will readily appreciate that many modifications are possible in the example embodiments without materially departing from the scope of inventive concepts in the claims.

What is claimed is:

1. An error correction code (ECC) decoder, comprising:

a buffer configured to store a plurality of read pages read from a plurality of multi-level cells connected to a same wordline;

a data converter configured to adjust reliability parameters of read bits of the plurality of read pages, based on state-bit mapping information and the plurality of read pages, to generate a plurality of ECC input data respectively corresponding to the plurality of read pages, the state-bit mapping information indicating mapping relationships between states and bits stored in the plurality of multi-level cells; and a decoding circuit configured to perform an ECC decoding operation on the plurality of read pages based on the plurality of ECC input data.

2. The ECC decoder of claim 1, wherein the decoding circuit is configured to perform an initial decoding operation on the plurality of read pages to correct errors per read page with respect to all of the plurality of read pages, the decoding circuit is configured to perform a re-decoding operation, in response to an uncorrected page existing among the plurality of read pages after the initial decoding operation, to correct errors in the uncorrected page based on corrected pages among the plurality of read pages, the uncorrected page indicates a read page among the plurality of read pages that is not error-corrected by the initial decoding operation, the corrected page indicates a read page among the plurality of read pages that is error-corrected by the initial decoding operation, and the ECC decoding operation includes the initial decoding operation and the re-decoding operation.

3. The ECC decoder of claim 2, wherein the data converter is configured to:

determine a read state corresponding to read bits of each multi-level cell among the plurality of multi-level cells;

determine a reference read voltage that is nearest to an average threshold voltage corresponding to the read state among a plurality of read voltages for determining each read bit of the each multi-level cell;

determine a voltage difference between the reference read voltage and the average threshold voltage corresponding to the read state; and adjust a reliability parameter of the each read bit based on the voltage difference to generate each bit of the plurality of ECC input data for the initial decoding operation.

4. The ECC decoder of claim 3, wherein the data converter is configured to decrease the reliability of the each read bit as the voltage difference is small.

5. The ECC decoder of claim 3, wherein the data converter is configured to increase the reliability parameter of the each read bit as the voltage difference is great.

6. The ECC decoder of claim 2, wherein the data converter is configured to:

receive results of the initial decoding operation with respect to the plurality of read pages from the decoding circuit;

determine a read state corresponding to read bits of each partially-corrected multi-level cell of the plurality of multi-level cells, the partially-corrected multi-level cell indicating a multi-level cell having at least one read bit that is corrected by the initial decoding operation;

determine candidate states corresponding to corrected bits in corrected pages of the each partially-corrected multi-level cell;

determine voltage differences between an average threshold voltage corresponding to the read state and the candidate states; and adjust a reliability parameter of a read bit in an uncorrected page of the partially-corrected multi-level cell to generate each bit of the plurality of ECC input data for the re-decoding operation.

7. The ECC decoder of claim 6, wherein the data converter is further configured to;

determine a reference state among the candidate states such that the reference state corresponds to a minimum voltage difference among the voltage differences; and compare a read bit of the uncorrected page and a reference bit of the reference state of the uncorrected page to adjust the reliability parameter of the read bit of the uncorrected page.

8. The ECC decoder of claim 7, wherein the data converter is configured to increase the reliability parameter of the read bit of the uncorrected page in response to a bit value of the read bit of the uncorrected page being equal to a bit value of the reference bit.

9. The ECC decoder of claim 7, wherein the data converter is configured to decrease the reliability parameter of the read bit of the uncorrected page in response to a bit value of the read bit of the uncorrected page being different from a bit value of the reference bit.

10. The ECC decoder of claim 6, wherein, with respect to each multi-level cell that is not error-corrected by the initial decoding operation, the data converter is configured to maintain the reliability parameter of a read bit of the multi-level cell without adjustment.

11. The ECC decoder of claim 2, wherein the data converter includes:

a state equalizer configured to generate a plurality of reliability adjustment information respectively corresponding to the plurality of read pages based on the state-bit mapping information and the plurality of read pages; and a log likelihood ratio (LLR) generator configured to generate, as the plurality of ECC input data, a plurality of LLRs respectively corresponding to the plurality of read pages by adjusting reliability parameters of read bits of the plurality of read pages based on the plurality of read pages and the plurality of reliability adjustment information.

12. The ECC decoder of claim 11, wherein the state equalizer is configured to:

determine a read state corresponding to read bits of each multi-level cell of the plurality of multi-level cells;

determine a reference read voltage that is nearest to an average threshold voltage corresponding to the read state among a plurality of read voltages for determining each read bit of the each multi-level cell;

determine a voltage difference between the reference read voltage and the average threshold voltage corresponding to the read state; and adjust reliability parameter of the each read bit based on the voltage difference to generate each bit of the plurality of ECC input data for the initial decoding operation.

13. The ECC decoder of claim 12, wherein the LLR generator is configured to generate the plurality of LLRs respectively corresponding to the plurality of read pages for the initial decoding operation based on the initial reliability adjustment information.

14. The ECC decoder of claim 11, wherein the state equalizer is configured to:

receive results of the initial decoding operation with respect to the plurality of read pages from the decoding circuit;

determine a read state corresponding to read bits of each partially-corrected multi-level cell of the plurality of multi-level cells, the partially-corrected multi-level cell indicating a multi-level cell having at least one read bit that is corrected by the initial decoding operation;

determine candidate states corresponding to corrected bits in corrected pages of the each partially-corrected multi-level cell;

determine voltage differences between an average threshold voltage corresponding to the read state and the candidate states; and adjust a reliability parameter of a read bit in the uncorrected page of the partially-corrected multi-level cell to generate each bit of the plurality of ECC input data for the re-decoding operation.

15. The ECC decoder of claim 14, wherein the LLR generator is configured to adjust the LLRs corresponding to the uncorrected page for the re-decoding operation based on the corrected reliability adjustment information.

16. The ECC decoder of claim 11, wherein the ECC decoding operation is based on a low density parity check (LDPC) code.

17. The ECC decoder of claim 16, wherein the data converter is configured to generate LLRs corresponding to the uncorrected page by adjusting a reliability parameter of a target region corresponding to a portion of a plurality of sub matrices of a parity check matrix of the LDPC code.

18. The ECC decoder of claim 1, wherein at least two read pages of the plurality of read pages are codewords that are encoded by different ECC schemes.

19. An error correction code (ECC) decoder, comprising:

a buffer configured to store a plurality of read pages read from a plurality of multi-level cells connected to a same wordline;

a state equalizer configured to generate a plurality of reliability adjustment information respectively corresponding to the plurality of read pages based on state-bit mapping information and the plurality of read pages, the state-bit mapping information indicating mapping relationships between states and bits stored in the plurality of multi-level cells;

a log likelihood ratio (LLR) generator configured to generate a plurality of LLRs respectively corresponding to the plurality of read pages by adjusting reliability parameters of read bits of the plurality of read pages based on the plurality of read pages and the plurality of reliability adjustment information; and a decoding circuit, the decoding circuit being configured to perform an initial decoding operation to correct errors per read page with respect to all of the plurality of read pages, and the decoding circuit being configured to perform a re-decoding operation, in response to an uncorrected page existing among the plurality of read pages after the initial decoding operation, to correct errors in the uncorrected page based on corrected pages among the plurality of read pages, the uncorrected page indicating a read page that is not error-corrected by the initial decoding operation, and the corrected page indicating a read page that is error-corrected by the initial decoding operation.

20. A memory system comprising:

a nonvolatile memory device including multi-level cells; and a memory controller configured to control an operation of the nonvolatile memory device, the memory controller including an error correction code (ECC) decoder configured to perform an ECC decoding operation with respect to data read from the nonvolatile memory device, the ECC decoder including a buffer, a data converter, and a decoding circuit, the buffer being configured to store a plurality of read pages read from a plurality of multi-level cells connected to a same wordline;

the data converter being configured to adjust reliability parameters of read bits of the plurality of read pages, based on state-bit mapping information and the plurality of read pages, to generate a plurality of ECC input data respectively corresponding to the plurality of read pages, the state-bit mapping information indicating mapping relationships between states and bits stored in the plurality of multi-level cells, and the decoding circuit being configured to perform an ECC decoding operation on the plurality of read pages based on the plurality of ECC input data.

* * * * *